(12) United States Patent
Matsuura et al.

(10) Patent No.: US 6,964,873 B2
(45) Date of Patent: Nov. 15, 2005

(54) SEMICONDUCTOR DEVICE HAVING A FERROELECTRIC CAPACITOR AND A FABRICATION PROCESS THEREOF

(75) Inventors: Katsuyoshi Matsuura, Kawasaki (JP); Mari Tani, Kawasaki (JP); Yoshimasa Horii, Kawasaki (JP); Fan Chu, Colorado Springs, CO (US); Glen R. Fox, Colorado Springs, CO (US); Brian Eastep, Colorado Springs, CO (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/551,233

(22) Filed: Apr. 17, 2000

(65) Prior Publication Data

US 2002/0177243 A1 Nov. 28, 2002

Related U.S. Application Data

(63) Continuation-in-part of application No. 09/429,984, filed on Oct. 29, 1999, now abandoned.

(51) Int. Cl.[7] .................. H01L 21/00; H01L 21/8242
(52) U.S. Cl. ..................... 438/3; 438/240; 438/253; 438/381
(58) Field of Search .............. 438/3, 240, 253, 438/381, 396; 257/295, 310, 303, 306

(56) References Cited

U.S. PATENT DOCUMENTS

| | | | | |
|---|---|---|---|---|
| 5,206,788 A | * | 4/1993 | Larson et al. | 361/313 |
| 5,426,075 A | * | 6/1995 | Perino et al. | 438/3 |
| 5,851,841 A | * | 12/1998 | Ushikubo et al. | 438/240 |
| 5,970,337 A | | 10/1999 | Nishioka | |
| 6,060,735 A | * | 5/2000 | Izuha et al. | 257/295 |
| 6,146,905 A | * | 11/2000 | Chivukula et al. | 438/3 |
| 6,165,802 A | * | 12/2000 | Cuchiaro et al. | 438/3 |
| 6,172,385 B1 | * | 1/2001 | Duncombe et al. | 257/295 |
| 6,201,271 B1 | | 3/2001 | Okutoh et al. | |
| 6,245,580 B1 | * | 6/2001 | Solayappan et al. | 438/3 |
| 6,287,637 B1 | * | 9/2001 | Chu et al. | 427/376.2 |
| 6,495,412 B1 | | 12/2002 | Zhu et al. | |

FOREIGN PATENT DOCUMENTS

| | | |
|---|---|---|
| EP | 0546325 A1 | 6/1993 |
| EP | 0766292 A2 | 4/1997 |
| EP | 0821415 A2 | 1/1998 |
| JP | 9-321234 | 12/1997 |
| JP | 10-294433 | 11/1998 |
| JP | 10-321809 | 12/1998 |

OTHER PUBLICATIONS

European Patent Office Search Report for EPO Application No. 00122735.4–2203 to Fujitsu Limited, Feb. 28, 2001.

* cited by examiner

Primary Examiner—Hsien Ming Lee
(74) Attorney, Agent, or Firm—William J. Kubida; Peter J. Meza; Hogan & Hartson, LLP

(57) ABSTRACT

A method of fabricating a semiconductor device having a ferroelectric capacitor includes the steps of forming a lower electrode layer of the ferroelectric capacitor on an insulation film covering an active device element, forming a ferroelectric film on the lower electrode layer as a capacitor insulation film, crystallizing the ferroelectric film by applying a thermal annealing process in an atmosphere containing a non-oxidizing gas and an oxidizing gas, and forming an upper electrode layer on the ferroelectric film.

1 Claim, 23 Drawing Sheets

SEMICONDUCTOR DEVICE HAVING A FERROELECTRIC CAPACITOR AND A FABRICATION PROCESS THEREOF

CROSS-REFERENCE TO RELATED APPLICATIONS

The present invention is a continuation-in-part application of the U.S. patent application Ser. No. 09/429,984 filed on Oct. 29, 1999, now abandoned.

BACKGROUND OF THE INVENTION

The present invention generally relates to semiconductor devices and more particularly to a semiconductor memory device having a ferroelectric capacitor.

Semiconductor devices such as DRAMs and SRAMs are used extensively in various information processing apparatuses including computers as a high-speed main memory device. These conventional semiconductor devices, however, are volatile in nature and the information stored therein is lost when the electric power is turned off. Thus, it has been practiced in conventional computers and computer systems to use magnetic disk devices as a large capacity, auxiliary storage device for storing programs and data.

However, magnetic disk devices are bulky and fragile, and are inherently vulnerable to mechanical shocks. Further, magnetic disk devices generally have drawbacks of large electrical power consumption and low access speed.

In view of the problems noted above, there is an increasing tendency in computers and computer systems of using flash-memory devices for the non-volatile auxiliary storage device. A flash-memory device is a device having a construction similar to that of a MOS transistor and stores information in an insulated floating gate in the form of electrical charges. It should be noted that flash-memory devices have a construction suitable for monolithic integration on a semiconductor chip in the form of an LSI. Thus, there are attempts to construct a large-capacity storage device comparable to a magnetic disk device by using a flash-memory.

In a flash-memory device, writing of information is achieved by tunneling of hot electrons through a tunneling insulation film into the floating gate electrode. Further, erasing of the information is achieved also by causing the electrons in the floating gate to tunnel to a source region or to a channel region through the tunneling insulation film. Thus, a flash-memory device has an inherent drawback in that it takes a substantial time for writing or erasing information. Further, a flash-memory device generally shows the problem of deterioration of the tunneling insulation film after a repeated writing and erasing operations. When the tunneling insulation film is deteriorated, the reading or erasing operation becomes unstable and unreliable. An EEPROM, having a similar construction to a flash-memory, has a similar problem.

In view of the various drawbacks of the foregoing conventional non-volatile semiconductor devices, there is a proposal of a ferroelectric semiconductor memory device designated hereinafter as FeRAM for the auxiliary memory device and further for the high-speed main memory device of a computer. A ferroelectric semiconductor memory device stores information in a ferroelectric capacitor insulation film in the form of spontaneous polarization.

A ferroelectric semiconductor memory device typically includes a memory cell transistor and a memory cell capacitor similarly to a DRAM, wherein the memory cell capacitor uses a ferroelectric material such as PZT ($Pb(Zr,Ti)O_3$) or PLZT (($Pb,La)(Zr,Ti)O_3$) for the capacitor insulation film. Thus, the ferroelectric semiconductor memory device is suitable for monolithic integration to form an LSI.

As the ferroelectric semiconductor memory device carries out the writing of information by controlling the spontaneous polarization of the ferroelectric capacitor insulation film, the writing is achieved with a high speed, faster by a factor of 1000 or more than the case of a flash-memory. As noted before, the writing of information is achieved in a flash-memory by injecting hot electrons into the floating gate through the tunneling insulation film. As the control of the polarization is achieved by simply applying a voltage, the power consumption is also reduced below about $\frac{1}{10}$ as compared with the case of a flash-memory. Further, the ferroelectric semiconductor memory device, lacking the tunneling insulation film, provides an increased lifetime of one hundred thousand times as large as the lifetime of a flash-memory device.

Currently, FeRAMs are fabricated according to a relatively easy design rule of about 1 $\mu$m. On the other hand, investigation is being made for increasing the tightness of the design rule so as to enable integration of the FeRAMs with other high-speed submicron devices such as CMOS logic devices on a common semiconductor chip.

FIG. 1 shows the construction of a conventional FeRAM 10.

Referring to FIG. 1, the FeRAM 10 includes a memory cell transistor constructed on a Si substrate 11, which may be any of the p-type or n-type. The half of the cell structure is represented in FIG. 1, wherein it should be noted that the process used in FIG. 1 is nothing more than an ordinary CMOS process. Thus, a p-type well 11A is formed on a Si substrate 11, on which an active region is defined by a field oxide film 12. On the Si substrate 11, there is provided a gate electrode 13 in correspondence to the foregoing active region, wherein the gate electrode 13 constitutes the word line of the FeRAM. Further, a gate oxide film not illustrated is interposed between the Si substrate 11 and the gate electrode 13, and diffusion regions 11B and 11C of the $n^+$-type are formed in the p-type well 11A at both lateral sides of the gate electrode 13 as the source region and the drain region of the memory cell transistor. Thereby, a channel region is formed in the p-type well 11A between the diffusion region 11B and the diffusion region 11C.

It should be noted that the gate electrode 13 is covered by a CVD oxide film 14 provided so as to cover the surface of the Si substrate 11 in correspondence to the active region. A lower electrode 15 having a Pt/Ti structure is deposited on the CVD oxide film 14, wherein the lower electrode 15 constitutes the drive line of the FeRAM.

A ferroelectric insulation film 16 of PZT or PLZT covers the lower electrode 15, and an upper electrode 17 of Pt is formed on the ferroelectric capacitor insulation film 16.

It should be noted that the lower electrode 15, the ferroelectric insulation film 16 and the upper electrode 17 form together a ferroelectric capacitor. The ferroelectric capacitor as a whole is covered by another interlayer insulation film 18.

A contact hole 18A is formed in the interlayer insulation film 18 so as to expose the upper electrode 17, and contact holes 18B and 18C are formed further in the interlayer insulation films 18 and 14 so as to expose the diffusion regions 11B and 11C, respectively.

The local interconnection pattern 19A is formed by an Al-alloy such that the local interconnection pattern 19A connects the contact hole 18A and the contact hole 18B electrically.

There is provided a bit line pattern 19B of an Al-alloy on the interlayer insulation film 18 so as to make an electrical contact with the diffusion region 11C at the contact hole 18C. The local interconnection pattern 19A and the bit line 19B are covered by a passivation film 20.

FIG. 2 shows the hysteresis appearing in the polarization of a PLZT film constituting the foregoing ferroelectric capacitor insulation film 16.

Referring to FIG. 2, it will be noted that the PLZT film 16 experiences an inversion of polarization when a predetermined write voltage is applied between the lower electrode 15 and the upper electrode 17 such that a predetermined electric field is applied to the PLZT film 16. In other words, desired information is written into the PLZT film 16 in the form of binary data by applying the write voltage across the upper electrode 17 and the lower electrode 15. Further, reading of the information thus written into the PLZT film 16 is achieved by detecting the conduction or no-conduction of the memory cell transistor, wherein such a detection is made by activating the foregoing word line, and hence the gate electrode 13, and further by detecting the voltage appearing at the bit line electrode 19B.

Larger the value of the spontaneous polarization represented in FIG. 2 by 2 Pr, the more the reliability of the retention of information in the PLZT film 16. Further, the magnitude of the electric field needed to cause a writing of information decreases with increasing value of 2 Pr. In other words, increase of the spontaneous polarization 2 Pr contributes to the decrease of the drive voltage of the FeRAM 10. Thus, there is a demand for increasing the value of the spontaneous polarization 2 Pr in the FeRAM 10 of FIG. 1.

It should be noted that the semiconductor memory device of FIG. 1 can be used also for a DRAM. In this case, due to the very large relative dielectric constant of the ferroelectric capacitor insulation film 16, a sufficient capacitance is secured without using a complicated shape and process for forming the memory cell capacitor.

In general, it is known that the ferroelectric properties of a PZT or PLZT film is related to the orientation of the PZT or PLZT crystals constituting the film. Commonly, a predominantly <111>- or <100>-orientation is obtained for a PZT or PLZT film formed on a Pt lower electrode, which has a self-textured <111>-orientation, due to the epitaxial effect, in which the surface energy is minimized as a result of the foregoing film orientation. It should be noted that a PZT or PLZT film has a self-textured <100>-orientation. In order to maximize the remnant polarization of the PZT or PLZT film, it is desired to align the PZT of PLZT crystals, which belong to the tetragonal crystal system, such that the switching direction for the preferential <100> orientation is perpendicular to the switching electric field.

Meanwhile, it is known that the PZT or PLZT film constituting the ferroelectric capacitor insulation film 16 of FIG. 1 shows a columnar microstructure and that the value of the spontaneous polarization 2 Pr is maximized when the crystal grains therein are oriented in the <111> direction.

In the formation of the ferroelectric capacitor as noted above, it is very important to crystallize the ferroelectric capacitor insulation film 16 by conducting a crystallization process. Without such a crystallization process, no desirable property is obtained for the ferroelectric capacitor.

Conventionally, such a ferroelectric capacitor is formed first by forming the adhesion layer of the Ti and then the lower electrode 15 of Pt by a sputtering process conducted on the interlayer insulation film 14 in a reducing atmosphere. Next, the ferroelectric capacitor insulation film 16 of PZT or PLZT is formed on the lower electrode 15 by a sputtering process or a sol-gel process.

Next, the ferroelectric capacitor insulation film 16 is subjected to a thermal annealing process in an oxidizing atmosphere at a temperature of typically 700–800° C., and the ferroelectric capacitor insulation film 16 thus formed undergoes a crystallization. Thereby, it has been practiced to conduct the crystallization process in an oxidizing atmosphere so that the formation of oxygen defects in the ferroelectric capacitor insulation film 16, caused as a result of diffusion of oxygen atoms from the ferroelectric capacitor insulation film 16 to the lower electrode 15, is successfully compensated for. As a result of the crystallization, the ferroelectric capacitor insulation film 16 shows a preferable hysteresis as represented in FIG. 2, with a spontaneous polarization 2 Pr.

On the other hand, in such a process of crystallizing the ferroelectric capacitor insulation film 16, it has been discovered that there occurs an extensive counter diffusion of Pt and O at the boundary between the lower Pt electrode 15 and the ferroelectric capacitor insulation film 16. More specifically, Pt from the lower electrode 15 penetrates into the ferroelectric capacitor insulation film 16 and O from the ferroelectric capacitor insulation film 16 penetrates into the lower electrode 15.

In order to avoid the foregoing problem of mutual diffusion, it is proposed to crystallize the ferroelectric capacitor insulation film 16 by RTA processes first conducted in an inert atmosphere and then conducted in an oxidizing atmosphere. By conducting the first RTA process in an inert atmosphere, the lower electrode 15 undergoes densification and the foregoing problem of counter diffusion of Pt and O is effectively suppressed.

Further, such a two-step annealing process suppresses the migration of Ti from the Ti adhesion layer to the surface of the lower electrode 15 through the grain boundary of Pt crystals constituting the lower electrode 15, wherein the Ti atoms thus reached the surface of the lower electrode 15 act as a nuclei for the <100> growth of the ferroelectric capacitor insulation film 16.

On the other hand, in the experimental investigation on such a ferroelectric capacitor formed by the two-step annealing process has revealed the fact that the ferroelectric capacitor insulation film thus formed tend to show a peeling, particularly in the marginal part of the semiconductor wafer where there is a shadow ring for preventing deposition of Pt on such marginal part of the semiconductor wafer. It should be noted that the semiconductor wafer is covered by a Ti film uniformly, while the deposition of Pt on such marginal part is prevented by the shadow ring so as to avoid unwanted deposition of Pt to the rear side of the wafer. As a result of the use of the shadow ring, the thickness of the Pt film constituting the lower electrode 15 decreases toward the marginal part of the semiconductor wafer, while it is noted that the problem of the peeling of the ferroelectric capacitor insulation film 16 occurs preferentially on such marginal part of the semiconductor wafer.

When such peeling occurs, the yield of production of the semiconductor device is deteriorated substantially.

SUMMARY OF THE INVENTION

Accordingly, it is a general object of the present invention to provide a novel and useful semiconductor device having a ferroelectric capacitor and a fabrication process thereof wherein the foregoing problems are eliminated.

Another and more specific object of the present invention is to provide a semiconductor device having a ferroelectric capacitor wherein the problem of peeling of the ferroelectric capacitor insulation film is effectively eliminated.

Another object of the present invention is to provide a fabrication process of a semiconductor device having a ferroelectric capacitor, comprising the steps of:

forming an insulation film over a substrate;

forming a lower electrode layer of said ferroelectric capacitor over said insulation film;

forming a ferroelectric film on said lower electrode layer as a capacitor insulation film of said ferroelectric capacitor;

crystallizing said ferroelectric film by applying a thermal annealing process in an atmosphere containing a non-oxidizing gas and an oxidizing gas; and forming an upper electrode layer on said ferroelectric film.

Another object of the present invention is to provide a method of fabricating a semiconductor device having a ferroelectric capacitor, comprising the steps of:

forming an active device element on a substrate;

forming an insulation film over said substrate to cover said active device element;

forming a lower electrode layer of said ferroelectric capacitor over said insulation film;

forming a ferroelectric film on said lower electrode layer as a capacitor insulation film of said ferroelectric capacitor;

crystallizing said ferroelectric film by applying a thermal annealing process in an atmosphere of an oxidizing gas under a reduced total pressure smaller than an atmospheric pressure; and forming an upper electrode layer on said ferroelectric film.

Another object of the present invention is to provide a semiconductor device, comprising:

an insulation film provided over a substrate;

a lower electrode provided over said insulation film;

a ferroelectric film provided on said lower electrode, said ferroelectric film having a columnar microstructure extending from an interface between said lower electrode and said ferroelectric film in a direction substantially perpendicular to a principal surface of said lower electrode, said ferroelectric film essentially consisting of crystal grains having a generally uniform grain diameter of less than about 200 nm; and an upper electrode provided on said ferroelectric film.

According to the present invention, the problem of peeling of the ferroelectric film is effectively eliminated by conducting the crystallization process in a mixed atmosphere of oxidizing gas and non-oxidizing gas. As a result of such a crystallization process, there appears a characteristic columnar microstructure in the ferroelectric film characterized by a generally uniform grain diameter of less than about 200 nm. By applying a further thermal annealing process to the ferroelectric film thus obtained in an oxidizing atmosphere, the oxygen defects in the ferroelectric film are effectively compensated for, and the ferroelectric film shows the desired large spontaneous polarization.

By conducting the crystallization process in an atmosphere containing oxygen in addition to an inert gas or a non-oxidizing gas, it is believed that the Ti atoms thus migrated through the lower electrode and reached the surface thereof undergoes oxidation and form a chemically stable compound. Thus, when the ferroelectric film is formed on the lower electrode, the ferroelectric film is maintained stably on the lower electrode, as there occurs no further oxidation, and associated swelling, in the Ti compound formed on the top surface of the lower electrode, even when the oxidizing process is applied to the ferroelectric film. Thereby, the problem of peeling of the ferroelectric film is successfully eliminated. As the atmosphere during the crystallization is still predominantly inert, in spite of the fact that the oxidizing gas is admixed to the non-oxidizing gas, there occurs a densification in the lower electrode during the crystallization process of the ferroelectric film, and the problem of counter diffusion of Pt and O at the interface between the ferroelectric film and underlying lower electrode is also suppressed.

The ferroelectric film thus formed has a columnar microstructure and the crystal grains therein are aligned predominantly in the <111> direction. Thereby, the ferroelectric capacitor thus formed shows a maximum spontaneous polarization 2 Pr.

Other objects and further features of the present invention will become apparent from the following detailed description when read in conjunction with the attached drawings.

DETAILED DESCRIPTION OF THE PREFERRED EMBODIMENT

[First Embodiment]

Hereinafter, the experiments conducted by the inventor of the present invention and constituting the basis of the present invention will be explained as a first embodiment of the present invention.

Figure 3A:
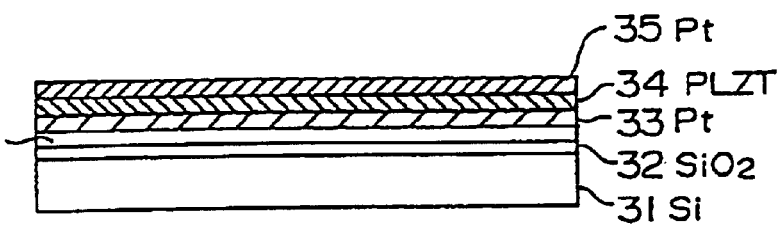
FIGS. 3A and 3B are diagrams showing the construction of a ferroelectric capacitor used in the experiments constituting the basis of the present invention as a test piece, according to a first embodiment of the present invention.
Figure 3B:
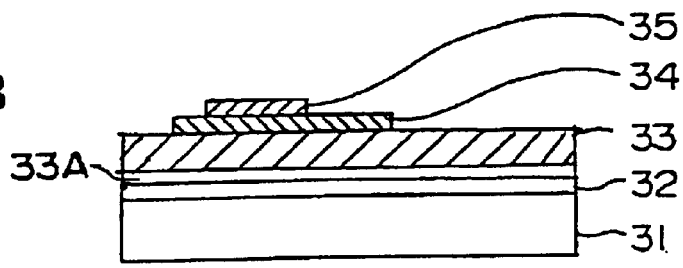

FIGS. 3A and 3B are diagrams showing the fabrication process of a ferroelectric capacitor test piece 30 used in the foregoing experiment.

Referring to FIG. 3A, a $SiO_2$ film 32 is formed on a Si substrate 31 by a thermal oxidation process with a thickness of 200 nm, for example, and a lower electrode 33 of Pt is formed on the $SiO_2$ film[108] 32 by a D.C. sputtering process conducted at a room temperature, with an adhesion layer 33A of Ti interposed between the $SiO_2$ film 32 and the lower electrode 33.

More specifically, the Ti adhesion layer 33A is formed in an Ar atmosphere under the pressure of 0.7 Pa with a thickness of about 20 nm as represented in TABLE I below. Further, the lower electrode 33 of Pt is formed under the same condition with a thickness of about 175 nm. The deposition of the Ti film 33A is conducted by setting the D.C. plasma power to 2.6 kW, wherein the deposition of the Ti film 33A is conducted for the duration of 9 seconds while the deposition of the lower electrode 33 is conducted for the duration of 96 seconds while setting the D.C. plasma power to 1.0 kW.

TABLE I

|    | Ar pressure (Pa) | DC power (kW) | duration (second) | thickness (nm) |
|----|------------------|---------------|-------------------|----------------|
| Ti | 0.7              | 2.6           | 9                 | 20             |
| Pt | 0.7              | 1.0           | 96                | 175            |

After the formation of the lower electrode 33, a PLZT film 34 is deposited thereon by an R.F. sputtering process conducted at the room temperature under the pressure of 1.1 Pa with a thickness of typically about 200 nm as represented in TABLE II below.

Referring to TABLE II, it will be noted that the R.F. sputtering is conducted by setting the R.F. plasma power to 1.0 kW and continued for the duration of 434 seconds.

TABLE II

| Ar pressure (Pa) | RF power (kW) | duration (seconds) | thickness (nm) |
|------------------|---------------|--------------------|----------------|
| 1.1              | 1.0           | 434                | 200            |

Figure 4A:
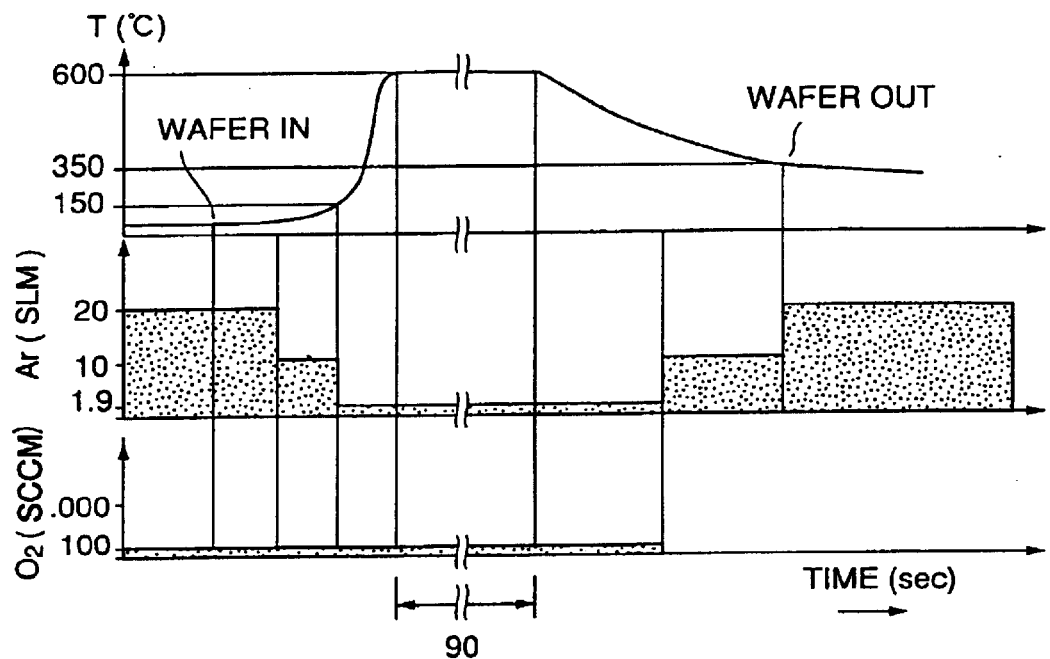
FIGS. 4A and 4B are diagrams showing the RTA temperature profile used in the foregoing experiments.

Next, the structure thus obtained is subjected to a thermal annealing process conducted at 600° C. for 90 seconds in various atmospheres as represented in TABLE III below, with an RTA temperature profile of 125° C./sec as represented in FIG. 4A.

Referring to FIG. 4A, the substrate 31 thus covered with the PLZT film 34 is incorporated into an RTA apparatus, which may be a lamp annealing apparatus, while controlling the temperature to the room temperature and the atmosphere to the atmosphere of predominantly Ar, admixed with a small amount of $O_2$. Next, the flow rate of Ar is reduced rapidly and the temperature is raised also rapidly to about 600° C. By holding the temperature at 600° C. for 90 seconds, the PLZT film 34 undergoes a crystallization. In the foregoing RTA process, the concentration of $O_2$ is changed variously as represented in TABLE III.

After the RTA process, the temperature is lowered and the concentration of Ar in the atmosphere is increased. The substrate 31 is then taken out from the RTA apparatus when the temperature is reached below about 350° C.

TABLE III

| RUN No. | 1st RTA 600° C. 90 s | 2nd RTA 725° C. 20 s | orientation (%) O(100) | O(101) | O(111) |
|---------|----------------------|----------------------|------------------------|--------|--------|
| 1       | $O_2$ 0.2%           | without              | 2.4                    | 0.3    | 97.3   |
| 2       | $O_2$ 1.0%           | without              | 1.3                    | 0.1    | 98.6   |
| 3       | $O_2$ 5.0%           | without              | 1.7                    | 0.1    | 98.2   |
| 4       | $O_2$ 0.2%           | $O_2$ 100%           | 2.2                    | 0.3    | 97.5   |
| 5       | $O_2$ 1.0%           | $O_2$ 100%           | 1.4                    | 0.1    | 98.5   |
| 6       | $O_2$ 5.0%           | $O_2$ 100%           | 2.4                    | 0.1    | 97.5   |

As represented in TABLE III, some of the samples (No. 4–No. 6) are further subjected to an oxidizing process conducted at 725° C. for 20 seconds with an RTA temperature profile set to 125° C./sec for compensating for the oxygen defects formed in the PLZT film 34.

Figure 4B:
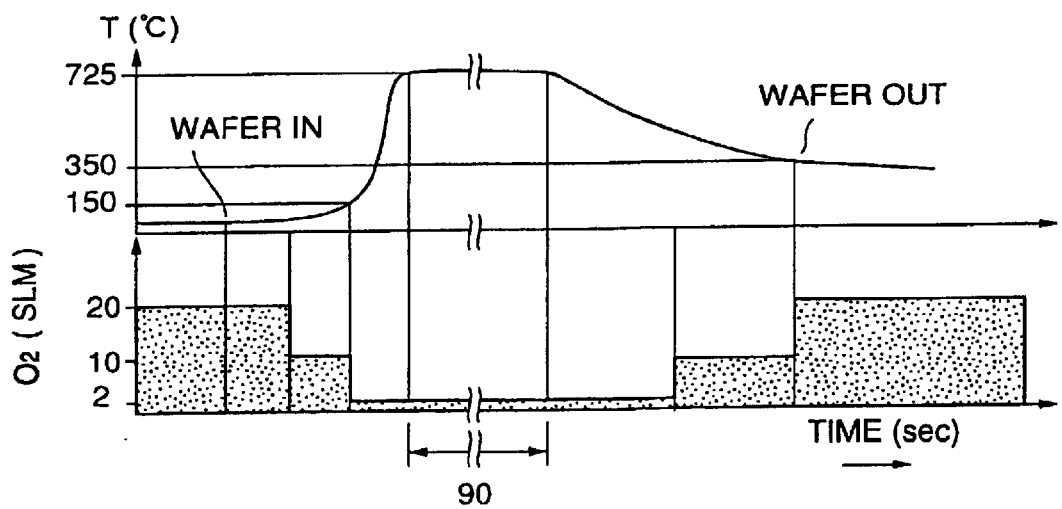

FIG. 4B shows the temperature profile of the second RTA process conducted in the oxidizing atmosphere.

Referring to FIG. 4B, the substrate 31 thus processed in the first RTA process is incorporated into an RTA apparatus, similar to the RTA apparatus used in the process of FIG. 4A while controlling the temperature to the room temperature and flowing $O_2$ with a flow rate of 20 SLM. Next, the flow rate of $O_2$ is reduced rapidly and the temperature is raised also rapidly to about 725° C. By holding the temperature at 725° C. for 20 seconds, the oxygen defects in the crystallized PLZT film 34 are effectively compensated for by oxygen.

After the RTA process, the temperature is lowered and the concentration of $O_2$ in the atmosphere is increased. The substrate 31 is then taken out from the RTA apparatus when the temperature is reached below about 350° C.

It should be noted that the PLZT film 34 thus formed by a sputtering process contains characteristically low concentration C (carbon) as compared with the PLZT film formed by a sol-gel process.

After the formation of the PLZT film 34, an upper electrode 35 of Pt is formed on the PLZT film 34 by a D.C. sputtering process conducted at the room temperature as represented in TABLE IV with a thickness of about 200 nm. As represented in TABLE IV, the formation of the upper electrode 35 is achieved in an Ar plasma by setting the D.C. plasma power to about 1.0 kW. In the example of TABLE IV, the Ar partial pressure is set to 0.7 Pa and the sputtering is continued for about 109 seconds.

TABLE IV

|    | Ar pressure (Pa) | RF power (kW) | duration (second) | thickness (nm) |
|----|------------------|---------------|-------------------|----------------|
| Pt | 0.7              | 1.0           | 109               | 200            |

Next, in the step of FIG. 3B, the upper electrode 35 and the PLZT film 34 are subjected to a plasma etching process and the desired ferroelectric capacitor 30 is obtained.

Figure 5A:
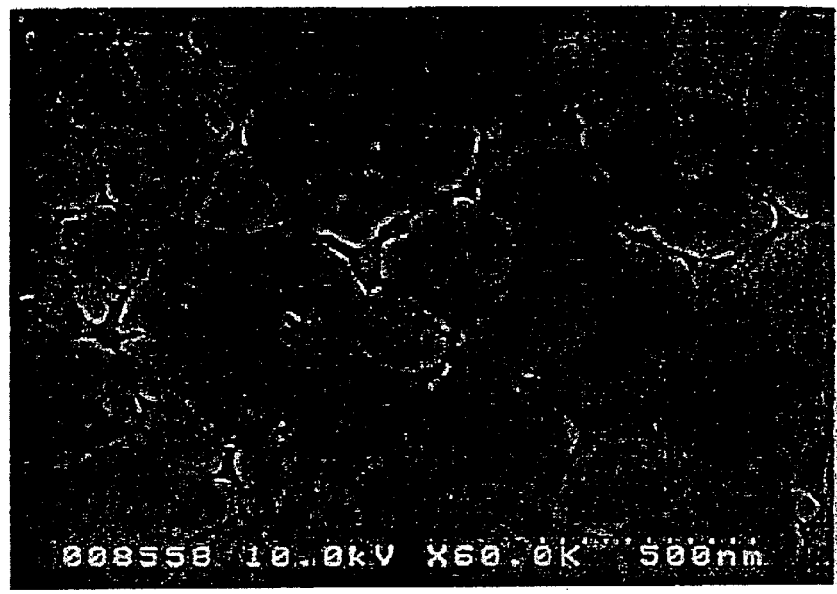
FIGS. 5A and 5B are diagrams showing the surface morphology and cross-sectional morphology of the ferroelectric film obtained in an experiment.
Figure 5B:
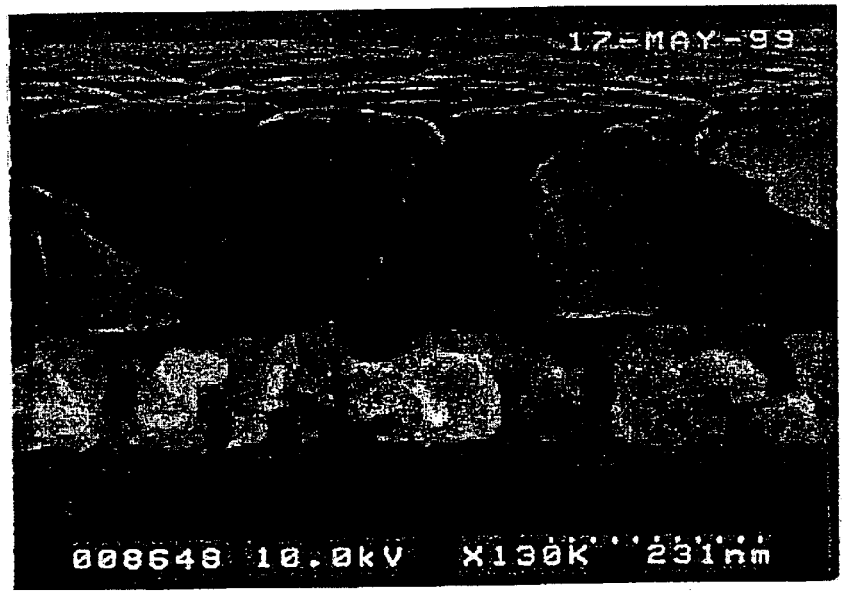

FIGS. 5A and 5B show the microstructure of the PLZT film 34 corresponding to the Run No. 4 before the upper electrode 35 is provided. As represented in TABLE III, the Run No. 4 includes a crystallization process of the PLZT film 34 conducted in an mixed atmosphere of Ar and $O_2$ in the first RTA process with the concentration of $O_2$ set to 0.2%, followed by the second RTA process of oxidizing annealing process conducted in the 100% $O_2$ atmosphere.

Referring to FIG. 5A showing the surface morphology, it can be seen that the PLZT film 34 has a granular microstructure with variously changing grain size, including large crystal grains having a grain diameter of as much as 200 nm. In the cross-sectional morphology represented in FIG. 5B, it can be seen that the microstructure is granular and the columnar microstructure is not recognized.

Figure 6A:
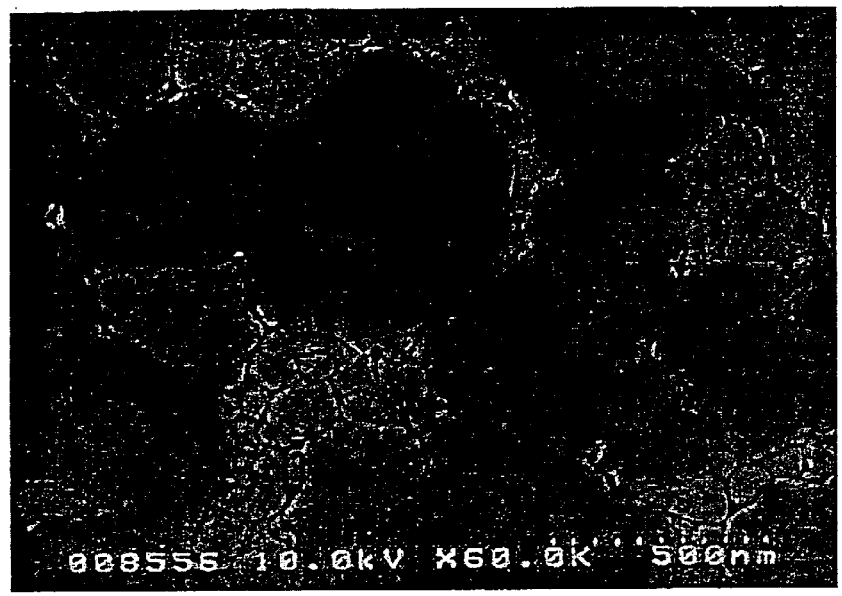
FIGS. 6A and 6B are diagrams showing the surface morphology and cross-sectional morphology of the ferroelectric film obtained in an experiment.
Figure 6B:
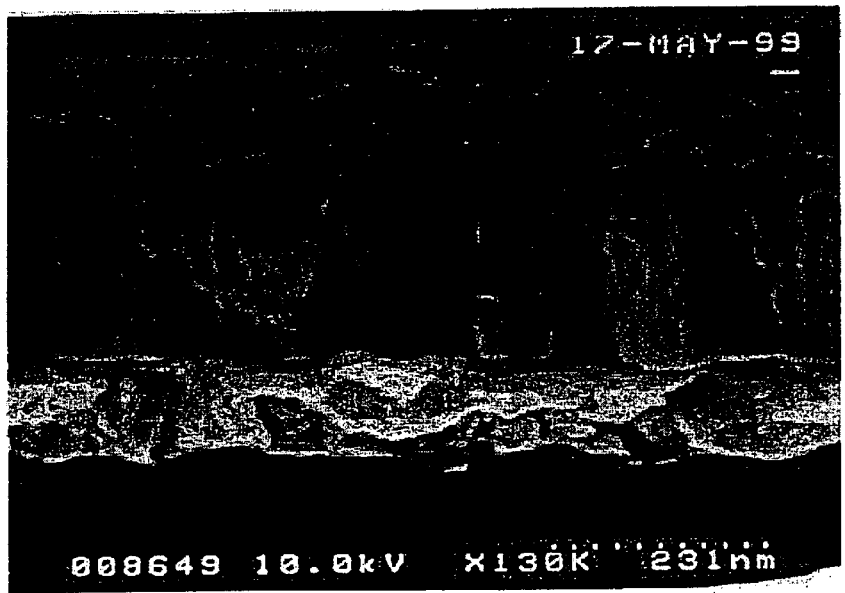

FIGS. 6A and 6B show the microstructure of the PLZT film 34 corresponding to the Run No. 5 before the upper electrode 35 is provided. As represented in TABLE III, the Run No. 5 includes a crystallization process of the PLZT film 34 conducted in an mixed atmosphere of Ar and $O_2$ in the first RTA process with the concentration of $O_2$ set to 1.0%, followed by the second RTA process of oxidizing annealing process conducted in the 100% $O_2$ atmosphere.

Referring to FIG. 6A showing the surface morphology, it can be seen that the PLZT film 34 has a granular microstructure similar to that of FIG. 5A with variously changing grain size, including large crystal grains having a grain diameter of as much as 200 nm. In the cross-sectional morphology represented in FIG. 6B, it can be seen that the microstructure has changed from granular to columnar.

Another interesting point to note in FIGS. 6A and 6B is that large grains are generally granular and do not show the columnar microstructure, while small grains do show the columnar microstructure. Further, the large grains of FIGS. 6A and 6B, and also the grains of FIGS. 5A and 5B, include little pinholes on the surface, while the small grains of FIGS. 6A and 6B do have some pinholes per each grain. As will be explained later, these pinholes are believed to indicate the location where the crystal is strained or deformed as a result of the existence of the oxygen defect. In the specimen that have been subjected to the second RTA process as in the case of the Run No. 4 –6, the number of the pinholes is reduced as compared with the specimen of the Run No. 1–3, as will be explained below.

Figure 7A:
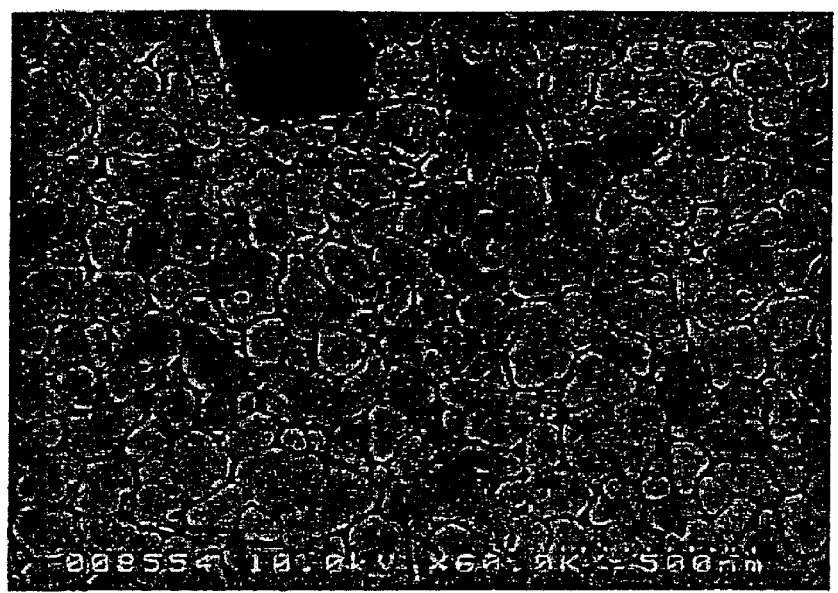
FIGS. 7A and 7B are diagrams showing the surface morphology and cross-sectional morphology of the ferroelectric film obtained in an experiment.
Figure 7B:
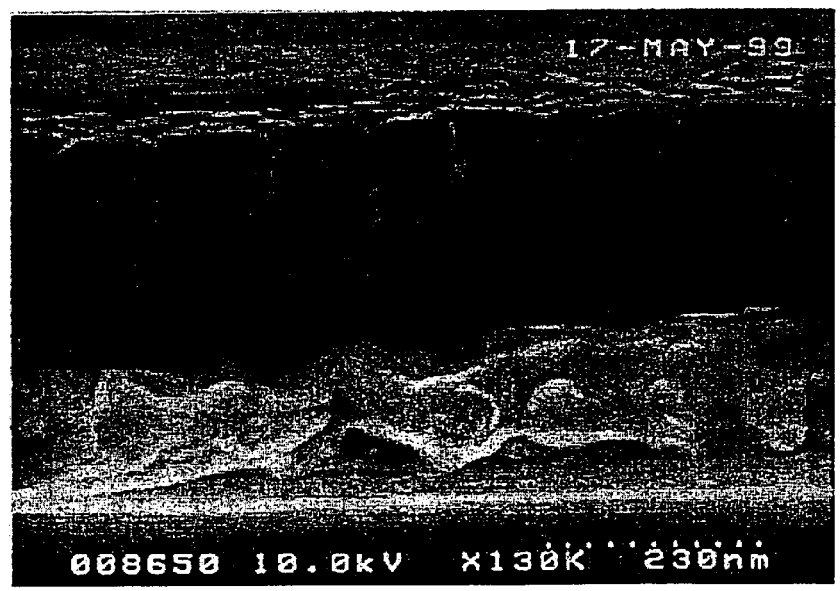

FIGS. 7A and 7B show the microstructure of the PLZT film 34 corresponding to the Run No. 6 before the upper electrode 35 is provided. As represented in TABLE III, the Run No. 6 includes a crystallization process of the PLZT film 34 conducted in an mixed atmosphere of Ar and $O_2$ in the first RTA process with the concentration of $O_2$ set to 5.0%, followed by the second RTA process of oxidizing annealing process conducted in the 100% $O_2$ atmosphere.

Referring to FIG. 7A showing the surface morphology, it can be seen that the PLZT film 34 has a uniform granular microstructure characterized by a generally uniform and small grain diameter of less than 200 nm. In the example of FIG. 7A, it appears that the PLZT crystal grains have a grain diameter of about 100 nm in average. In the cross-sectional morphology represented in FIG. 7B, it can be seen that the PLZT film 34 has a clear columnar microstructure extending perpendicularly to the principal surface of the underlying Pt electrode 33. Because of the columnar growth of the individual PLZT crystal grains, it can be seen that each crystal grain of FIG. 7A is separated from neighboring crystal grains by a minute gap defining the grain boundary.

Thus, by comparing the morphology of FIGS. 5A, 6A and 7A, or FIGS. 5B, 6B and 7B, it can be seen that the grain diameter of the PLZT crystals changes sharply with the oxygen concentration in the atmosphere used for the first RTA process. It should be noted that such a Ti-phase is formed as a result of the diffusion of the Ti atoms from the Ti layer 33A through the Pt lower electrode 33. Due to the fact that the Ti-phase is oxidized already during the crystallization process of the PLZT film 34, there occurs no further oxidation in the Ti-phase and the peeling of the PLZT film 34 is positively eliminated.

Figure 8A:
FIGS. 8A and 8B are diagrams showing the surface morphology and cross-sectional morphology of the ferroelectric film obtained in an experiment.
Figure 8B:
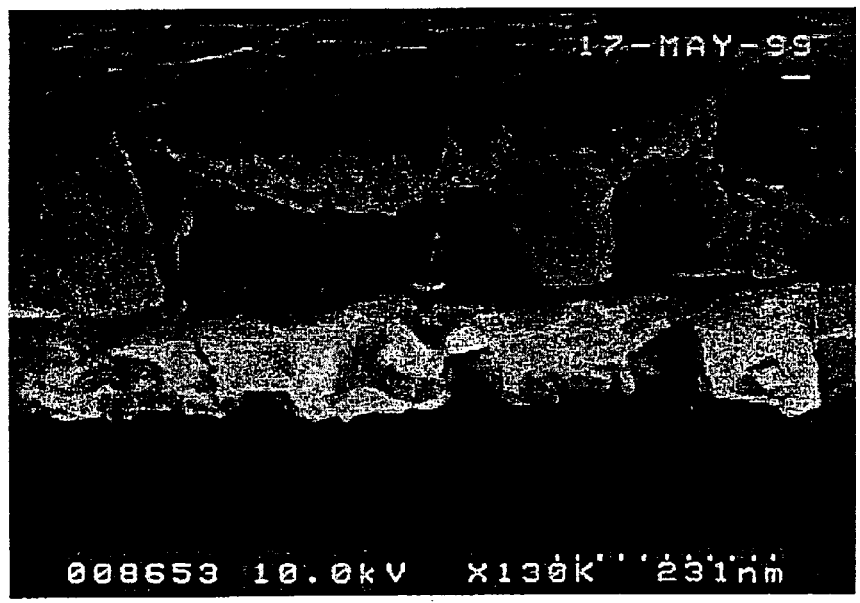

FIGS. 8A and 8B show the microstructure of the PLZT film 34 corresponding to the Run No. 1 before the upper electrode 35 is provided. As represented in TABLE III, the Run No. 1 includes a crystallization process of the PLZT film 34 conducted in an mixed atmosphere of Ar and $O_2$ in the first RTA process with the concentration of $O_2$ set to 0.2%, while there is no second RTA process conducted in the 100% $O_2$ atmosphere for compensating for the oxygen deficiency.

Referring to FIG. 8A showing the surface morphology, it can be seen that the PLZT film 34 has a granular microstructure, with the majority of the crystal grains having a size exceeding about 200 nm. In the cross-sectional morphology represented in FIG. 8B, it can be seen that the microstructure is granular and the columnar microstructure is not recognized.

FIGS. 8A and 8B further indicates that each of the PLZT crystal grains has a somewhat clouded appearance, while it is believed that this clouded appearance indicates the existence of crystal defects caused by oxygen deficiency.

Figure 9A:
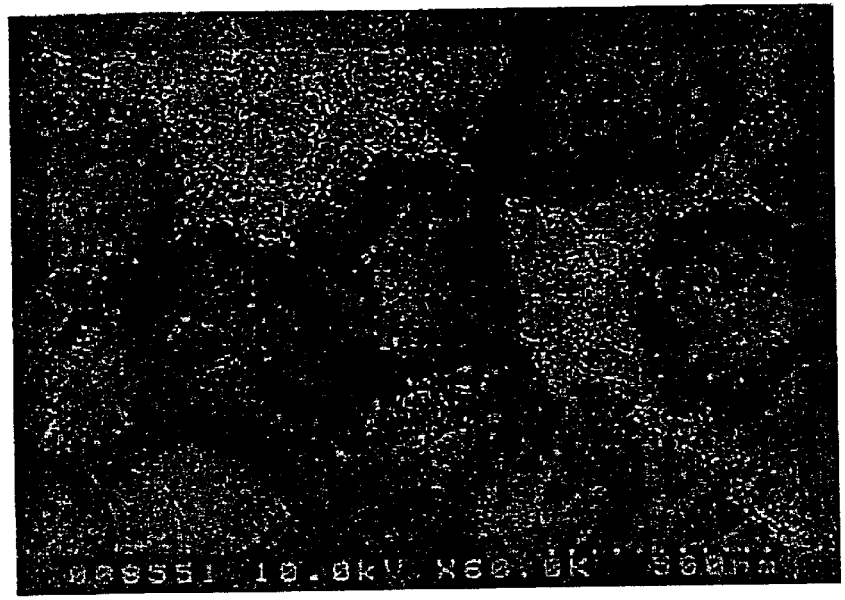
FIGS. 9A and 9B are diagrams showing the surface morphology and cross-sectional morphology of the ferroelectric film obtained in an experiment.
Figure 9B:

FIGS. 9A and 9B show the microstructure of the PLZT film 34 corresponding to the Run No. 2 before the upper electrode 35 is provided. As represented in TABLE III, the Run No. 2 includes a crystallization process of the PLZT film 34 conducted in an mixed atmosphere of Ar and $O_2$ in the first RTA process with the concentration of $O_2$ set to 1.0%. Similarly to Run No. 1 of FIGS. 8A and 8B, there is no second RTA process conducted in the 100% $O_2$ atmosphere for compensating for the oxygen deficiency.

Referring to FIG. 9A showing the surface morphology, it can be seen that the PLZT film 34 has a granular microstructure, with the majority of the crystal grains having a grain diameter of about 200 nm. In the cross-sectional morphology represented in FIG. 9B, it can be seen that there appears a columnar microstructure, contrary to the microstructure of FIG. 8B.

FIGS. 9A and 9B further indicates that each of the PLZT crystal grains has a somewhat clouded appearance similarly to the microstructure of FIGS. 8A and 8B, wherein this clouded appearance of the crystal grains is believed to indicate the existence of crystal defects caused by oxygen deficiency.

Figure 10A:
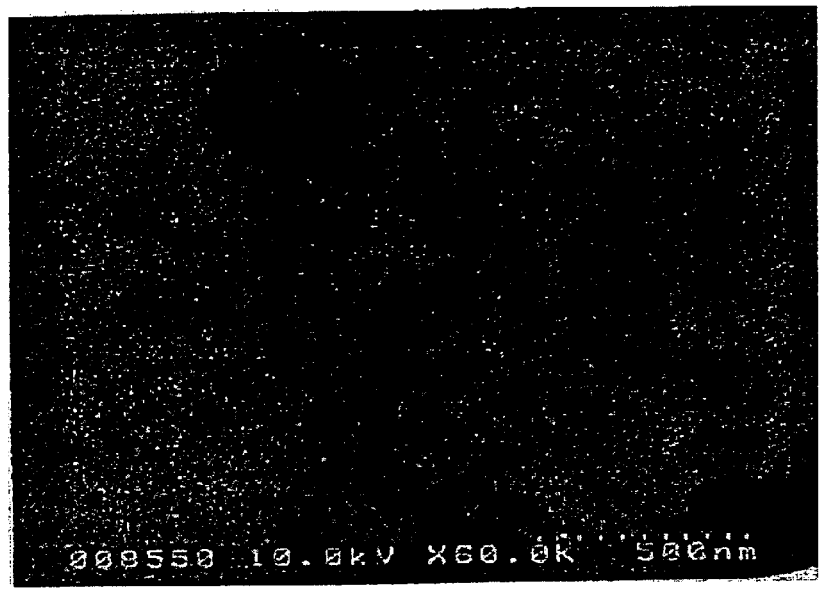
FIGS. 10A and 10B are diagrams showing the surface morphology and cross-sectional morphology of the ferroelectric film obtained in an experiment.
Figure 10B:
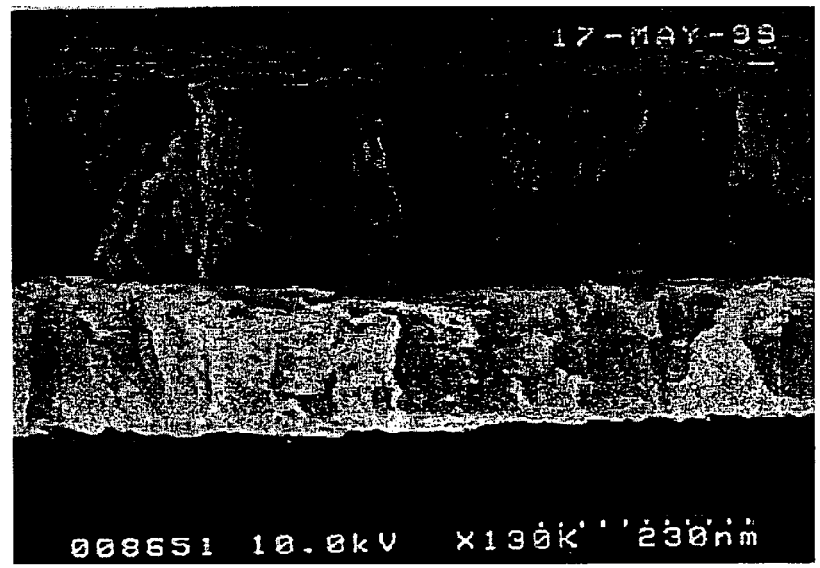

Further, FIGS. 10A and 10B show the microstructure of the PLZT film 34 corresponding to the Run No. 3 before the upper electrode 35 is provided. As represented in TABLE III, the Run No. 3 includes a crystallization process of the PLZT film 34 conducted in an mixed atmosphere of Ar and $O_2$ in the first RTA process with the concentration of $O_2$ set to 5.0%. Similarly to Run No. 1 of FIGS. 8A and 8B, there is no second RTA process conducted in the 100% $O_2$ atmosphere for compensating for the oxygen deficiency.

Referring to FIG. 10A showing the surface morphology, it can be seen that the PLZT film 34 has a granular microstructure, with the majority of the crystal grains having a grain diameter of less than 200 nm. In the average, it appears that the PLZT crystal grains have an average diameter of about 150 nm. In the cross-sectional morphology represented in FIG. 10B, it can be seen that there appears a distinct columnar microstructure, similar to that of FIG. 7B.

FIGS. 10A and 10B further indicates that each of the PLZT crystal grains has a somewhat clouded appearance similarly to the microstructure of FIGS. 8A and 8B or FIGS. 9A and 9B, wherein this clouded appearance of the crystal grains is believed to indicate the existence of crystal defects caused by oxygen deficiency.

Figure 11A:
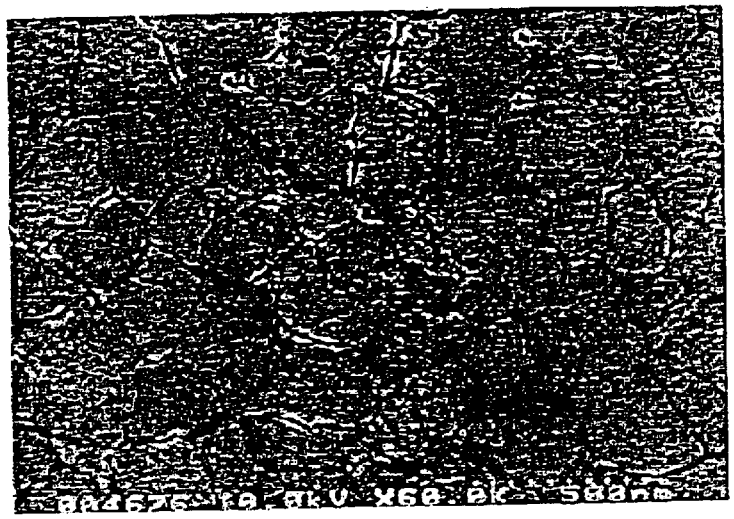
FIGS. 11A and 11B are diagrams showing the surface morphology and cross-sectional morphology of the ferroelectric film obtained in an experiment.
Figure 11B:
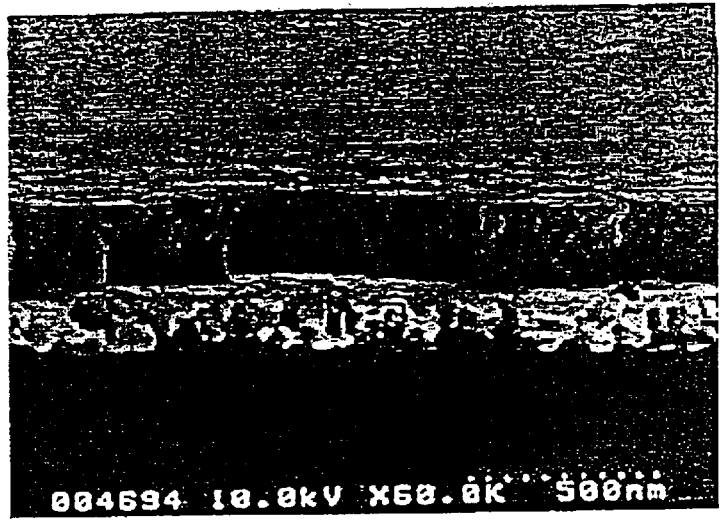

Further, FIGS. 11A and 11B show the microstructure of the PLZT film 34 before the upper electrode 35 is provided, wherein FIGS. 11A and 11B show the crystallization process of the PLZT film 34 conducted in an Ar atmosphere in the first RTA, followed by the second RTA process conducted in the 100% $O_2$ atmosphere at 725° C. for compensating for the oxygen deficiency.

Referring to FIG. 11A showing the surface morphology, it can be seen that the PLZT film 34 has a granular microstructure, with a generally uniform crystal grain diameter of about 200 nm. In the cross-sectional morphology represented in FIG. 11B, on the other hand, it can be seen that there is no columnar microstructure in the PLZT film 34.

As a result of the second RTA process for compensating $O_2$, the clouded appearance of the crystal grains is disappeared, and instead, there appear a pinhole structure in the surface of the PLZT crystal grains.

Figure 12:
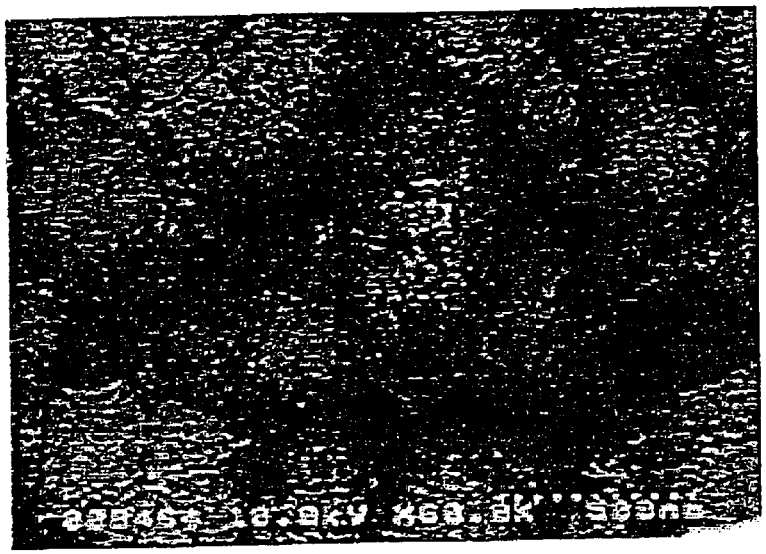
FIG. 12 is a diagram showing the surface morphology of the ferroelectric film obtained in an experiment.

Further, FIG. 12 shows the surface morphology of the PLZT film 34 in the case in which the first RTA step is conducted in a pure Ar atmosphere. No second RTA process is applied.

Referring to FIG. 12, it can be seen that the crystal grains have an average diameter of about 200 nm or more, contrary to the case of conducting the first RTA process in the oxygen-containing atmosphere. In view of the absence of the second RTA process, the microstructure of FIG. 12 still contains a large amount of oxygen defects, while the existence of the oxygen defects is represented as a result of the clouded or stained view of the crystal grains.

Figure 13:
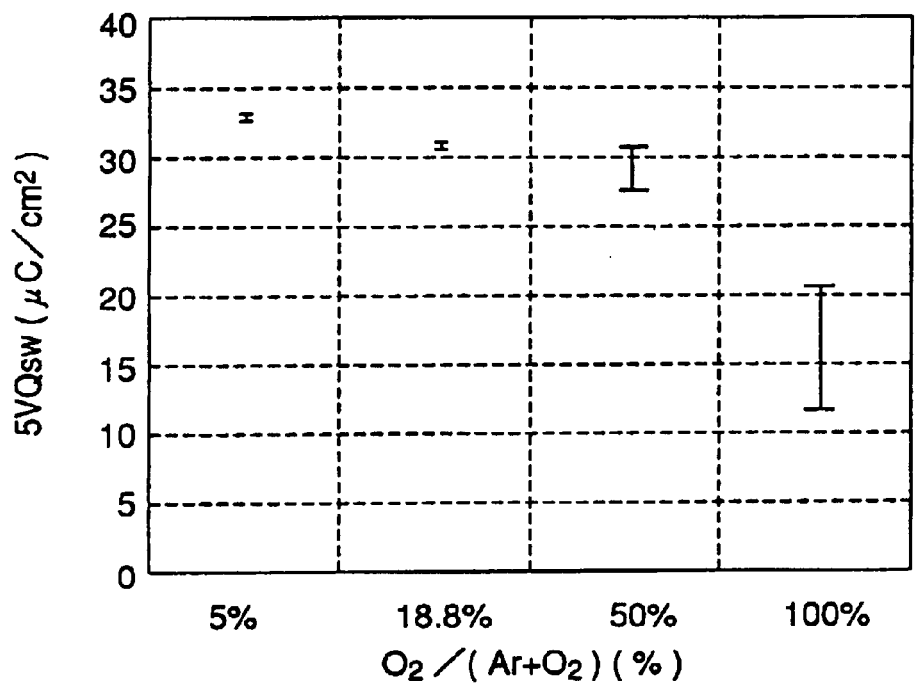
FIG. 13 is a diagram showing the switching electric charges of the ferroelectric capacitor for various RTA conditions.

FIG. 13 shows the switching electric charges Qsw of the ferroelectric capacitor 30 of FIG. 3B for various oxygen concentrations used in the first RTA process. In FIG. 13 it should be noted that all the experimental data are for the specimen subjected to the first and second RTA processes as represented in FIGS. 4A and 4B.

Referring to FIG. 13, it can be seen that a value of Qsw exceeding 25 $\mu C/cm^2$ is achieved up to the concentration level of $O_2$ of about 50% in volume. When the $O_2$ concentration level exceeds 50%, on the other hand, the value of the switching electric charges drops sharply.

Figure 1:
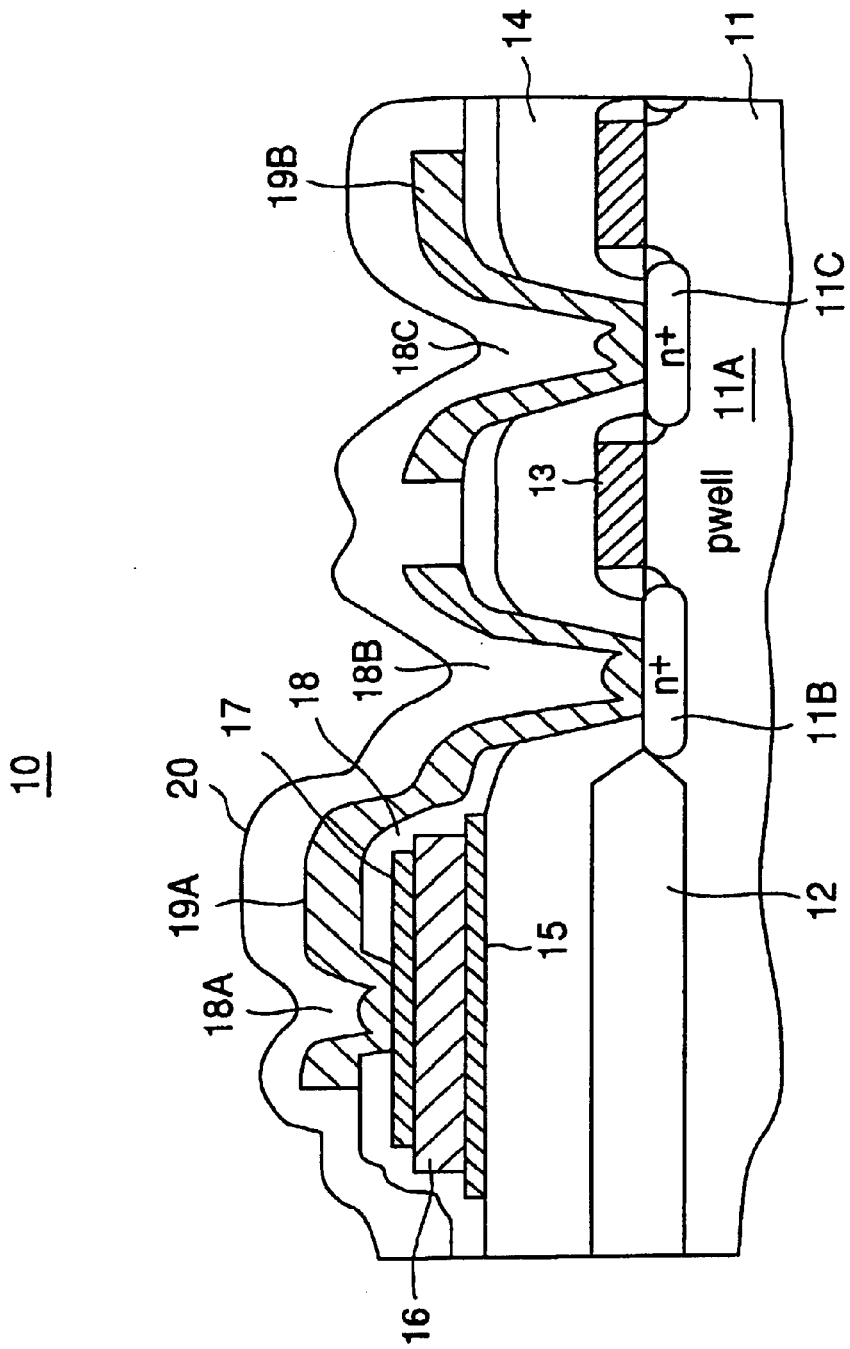
FIG. 1 is a diagram showing the construction of a conventional FeRAM.
Figure 2:
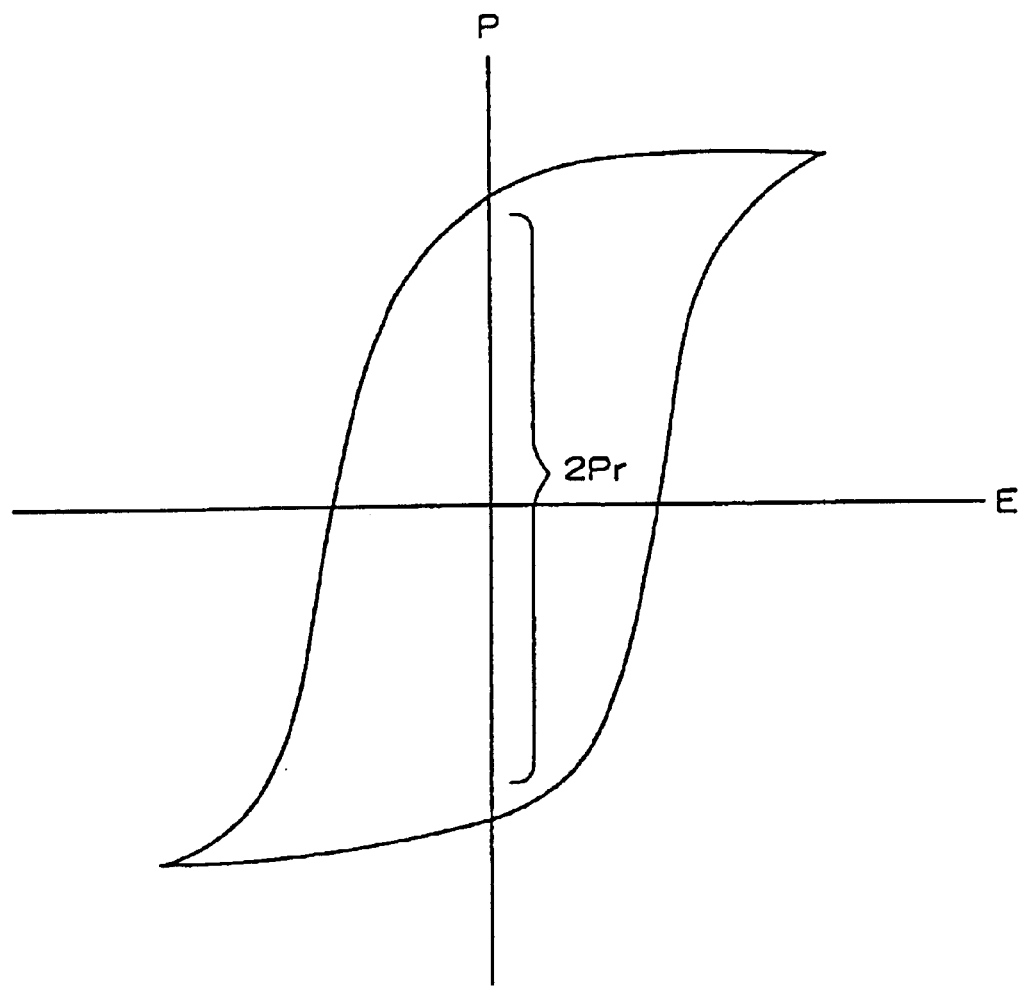
FIG. 2 is a diagram showing a hysteresis loop of a ferroelectric material used for an FeRAM.
Figure 14:
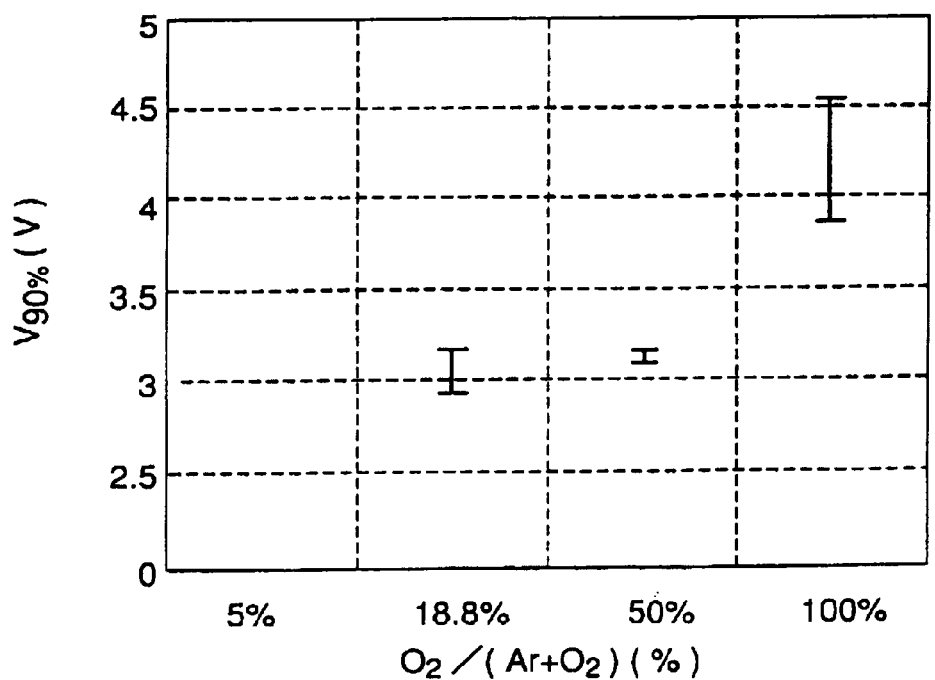
FIG. 14 is a diagram showing the saturation voltage of the ferroelectric capacitor for various RTA conditions.

FIG. 14 shows the 90%-saturation voltage $V_{90\%}$ of the ferroelectric capacitor 30, wherein the 90%-saturation voltage represents the voltage applied across the upper and lower electrodes 35 and 33 so as to cause a 90% saturation in the polarization of the ferroelectric capacitor insulation film 34. See FIG. 2. In FIG. 14, too, all the experimental data are for the specimen subjected to the first and second RTA processes as represented in FIGS. 4A and 4B.

Referring to FIG. 14, it can be seen that a low voltage of almost 3 V is realized for the 90%-saturation voltage, as long as the $O_2$ concentration level in the atmosphere of the first RTA process does not exceed 50% in volume. On the other hand, when a pure $O_2$ atmosphere is used in the first RTA process, the 90%-saturation voltage increases sharply and reaches about 4 V or more.

Figure 15:
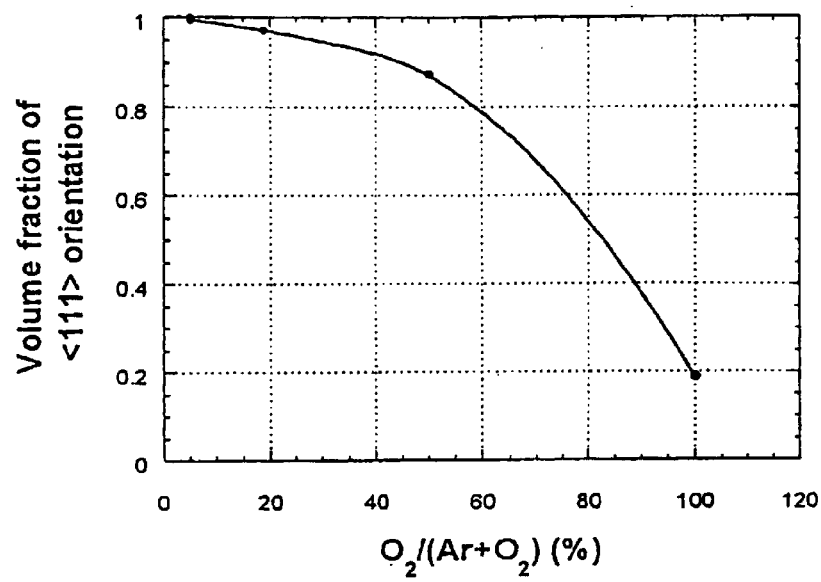
FIG. 15 is a diagram showing the volume fraction of the <111>-oriented crystals in the ferroelectric film of the ferroelectric capacitor for various RTA conditions.

FIG. 15 shows the volume fraction of the <111>-oriented crystal grains in the PLZT film 34, as a function of the $O_2$ concentration level in the first RTA process. Similarly as before, all the data of FIG. 15 are for the specimen subjected to the first RTA process and the second RTA process as represented in FIGS. 4A and 4B.

Referring to FIG. 15, it can be seen that the volume fraction of the <111>-oriented crystal grains decreases gradually with increasing $O_2$ concentration level in the atmosphere used in the first RTA process, until the $O_2$ concentration level reaches about 50% in volume. When the $O_2$ concentration level exceeds the foregoing level of 50%, on the other hand, the proportion of the <111>-oriented crystal grains decreases sharply.

Figure 16:
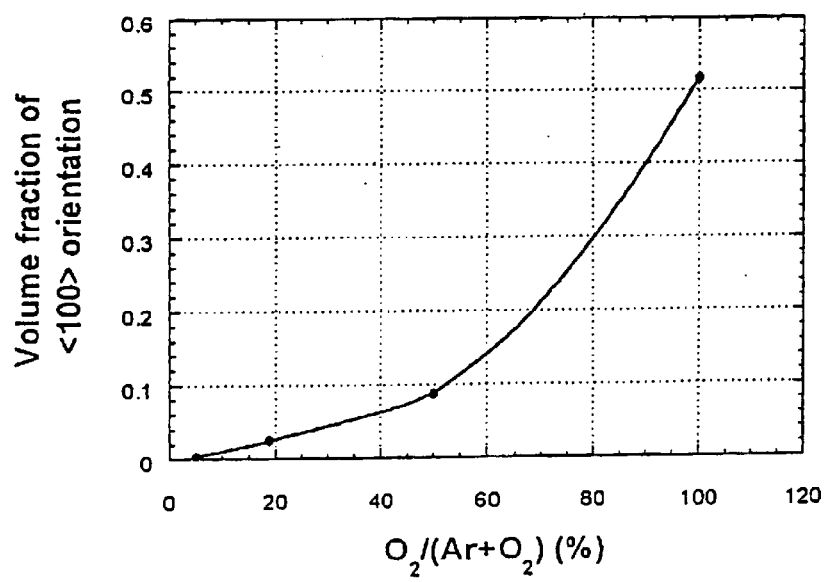
FIG. 16 is a diagram showing the volume fraction of the <100>-oriented crystals in the ferroelectric film of the ferroelectric capacitor for various RTA conditions.

Further, FIG. 16 shows the volume fraction of the <100>-oriented crystal grains in the PLZT film 34, as a function of the $O_2$ concentration level in the first RTA process. Similarly as before, all the data of FIG. 16 are for the specimen subjected to the first RTA process and the second RTA process as represented in FIGS. 4A and 4B.

Referring to FIG. 16, it can be seen that the volume fraction of the <100>-oriented crystal grains increases gradually with increasing $O_2$ concentration level in the atmosphere used in the first RTA process, until the $O_2$ concentration level reaches about 50% in volume. When the $O_2$ concentration level exceeds the foregoing level of 50%, on the other hand, the proportion of the <100>-oriented crystal grains increases sharply.

Summarizing above, it is desirable, in view of eliminating the peeling of the ferroelectric film 34 of the ferroelectric capacitor 30 to conduct the first RTA process in the atmosphere containing a small amount of oxidizing gas in addition to an inert gas, wherein the concentration of the oxidizing gas is preferably larger than about 1% but not exceeding about 50%, in view of the electric property of the obtained ferroelectric film and hence the performance of the ferroelectric capacitor. The ferroelectric film thus processed with such a partially oxidizing atmosphere in the first RTA process is characterized by the columnar microstructure of the crystal grains having the <111>-orientation and a grain size of about 200 nm or less, in average about 150 nm.

As the atmosphere during the crystallization is still predominantly inert in the present invention, in spite of the fact that the oxidizing gas is admixed to the non-oxidizing gas, there occurs a densification in the lower electrode during the crystallization process of the ferroelectric film, and the problem of mutual diffusion of Pt and O at the interface between the ferroelectric film and underlying lower electrode is also suppressed.

[Second Embodiment]

Next, a second embodiment of the present invention will be described with reference to FIGS. 3A and 3B used for explaining the first embodiment.

Referring to FIG. 3A, the present embodiment forms the PLZT film 34 on the lower electrode 33 of Pt by a sputtering process with a thickness of about 200 nm similarly as in the case of the first embodiment, except that the present embodiment carries out a crystallizing annealing process of the PLZT film 24 under a reduced $O_2$ pressure environment. In a typical example, the total pressure of the $O_2$ atmosphere is set to about 1 Torr and the crystallization of the PLZT film 34 is conducted in the $O_2$ atmosphere at a temperature of 650° C. for 2 minutes.

After the crystallization process, the PLZT film 34 is subjected to a thermal annealing process conducted in an $O_2$ atmosphere of the ordinary pressure (760 Torr) at the temperature of 750° C. for 1 minute.

After the formation and processing of the PLZT film 34 as noted above, a film of $IrO_2$ is deposited on the PLZT film 34 to form the upper electrode layer 35 as represented in FIG. 3A, followed by a patterning process conducted in the step of FIG. 3B to form the upper electrode pattern designated also by the numeral 35. The upper electrode layer 35 of $IrO_2$ is subjected to a recovery annealing process conducted in an $O_2$ atmosphere at 650° C. for about 60 minutes, and the PLZT film 34 is further subjected to a patterning process to form the ferroelectric capacitor insulation film also designated by the reference numeral 34 in FIG. 3B.

According to the crystallization process conducted in such a reduced pressure environment of $O_2$, the oxidation of the lower electrode 33 of Pt is avoided and there occurs a densification in the electrode 33 similarly to the case of the first embodiment. Thereby, the migration of Ti from the underlying adhesion layer 33A to the surface of the lower electrode 33 is suppressed and the growth of the PLZT film 34 in the <111>-direction is facilitated.

By using a small amount of $O_2$ in the crystallizing process, the Ti atoms that have reached the surface of the lower electrode 33 are oxidized to form a chemically stable compound. Thereby, the problem of cracking at the interface between the lower electrode 33 and the PLZT film 34 due to the volume increase associated with the oxidation of Ti is effectively avoided.

Figure 17:
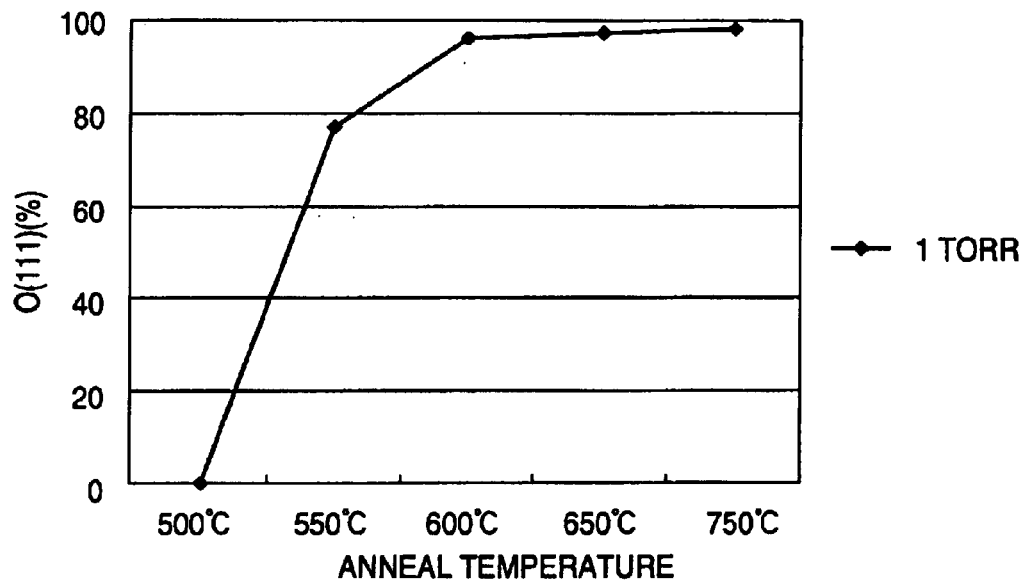
FIG. 17 is a diagram showing the volume fraction of the <111>-oriented crystals in the ferroelectric film of the ferroelectric capacitor crystallized under various temperatures in a reduced pressure environment according to a second embodiment.

FIG. 17 shows the volume fraction of the <111>-oriented crystal grains in the PLZT film 34 of the ferroelectric capacitor of FIG. 3B with respect to the <101>- or <100>-oriented crystal grains according to a second embodiment of the present invention wherein the present embodiment carries out the crystallization process before the upper electrode layer 35 is formed.

As represented in FIG. 17, a volume fraction of almost 100% is conducted at the temperature of 600° C. or higher, indicating that there occurs an effective densification in the lower electrode 33 of Pt as a result of the crystallization process of the PLZT film 34 thus conducted in a reduced total pressure environment of $O_2$ atmosphere. Further, the use of the $O_2$ atmosphere effectively eliminates the cracking of the PLZT film 34 at the interface to the lower electrode 33. In the experiment of FIG. 17, it should be noted that the PLZT film 34 showed no crystallization when the temperature is set to 500° C. or less. When the temperature is set to 550° C., a proportion of 77.7% is obtained for the <111>-oriented crystal grains.

Figure 18:
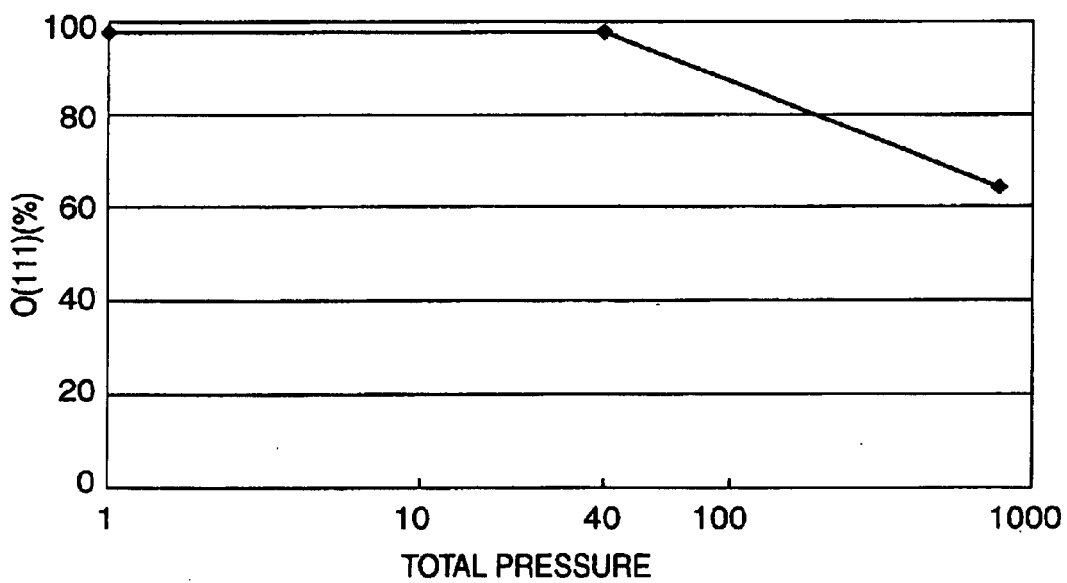
FIG. 18 is a diagram showing the volume fraction of the <111>-oriented crystals in the ferroelectric film of the ferroelectric capacitor crystallized under various reduced pressure conditions.

FIG. 18 shows the volume fraction of the <111>-oriented PLZT crystal grains in the PLZT film 34 for various total pressures of the $O_2$ atmosphere used in the crystallization process of the PLZT film 34.

Referring to FIG. 18, it can be seen that a proportion of almost 100% is obtained for the <111>-oriented crystal grains in the PLZT film 34 when the total pressure of the $O_2$ atmosphere used for crystallizing the PLZT film 34 is set to be about 40 Torr or less. On the other hand, the use of excessively low $O_2$ pressure less than 0.5 Torr in the crystallization process may cause the problem of cracking of the PLZT film 34 as explained previously. Thus, it is thought preferable to set the total pressure of the $O_2$ atmosphere to be about 1 Torr or higher.

Figure 19:
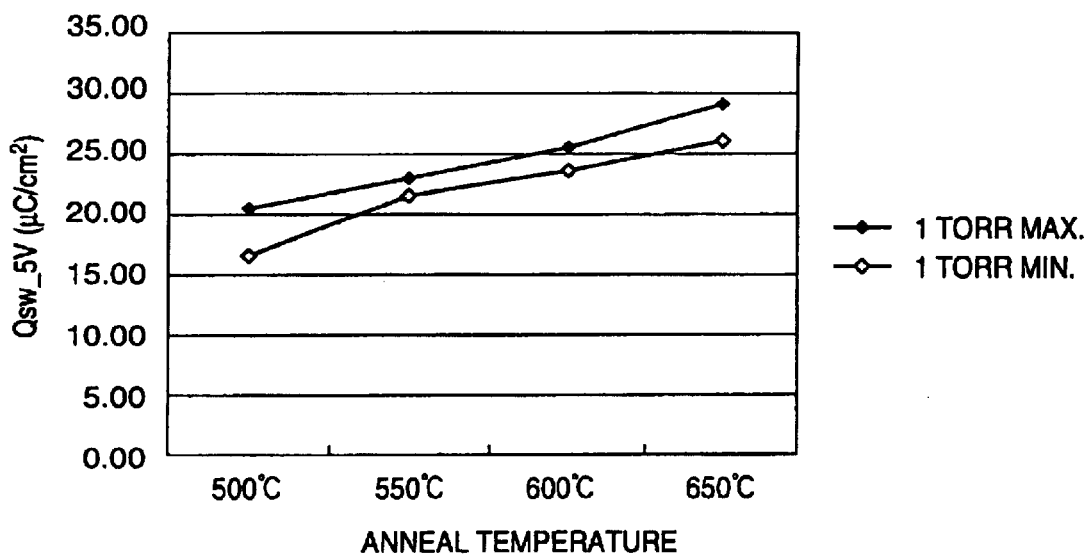
FIG. 19 is a diagram showing the switching electric charge of the ferroelectric capacitor for various annealing temperatures conducted under a reduced pressure environment for crystallizing the ferroelectric film.

FIG. 19 shows the switching electric charge $Q_{SW}$ for the ferroelectric capacitor thus obtained, wherein the vertical axis represents the switchinelectric charge $Q_{SW}$ while the horizontal axis represents the temperature used for crystallizing the PLZT film 34. The result of FIG. 19 is for the case in which the crystallization process is conducted under a reduced pressure environment in which the total pressure is set to 1 Torr. FIG. 19 shows the minimum $Q_{SW}$ value observed by open diamonds and the maximum $Q_{SW}$ value by solid diamonds.

As can be seen from FIG. 19, a value of between about 25 $\mu C/cm^2$ and about 30 $\mu C/cm^2$ is obtained for the switching electric charge $Q_{SW}$ when the crystallization process is conducted at 650° C., wherein this value of $Q_{SW}$ is substantially improved as compared with the case in which the PLZT film 34 is annealed in an $O_2$ atmosphere of ordinary pressure. See FIG. 13.

Figure 20:
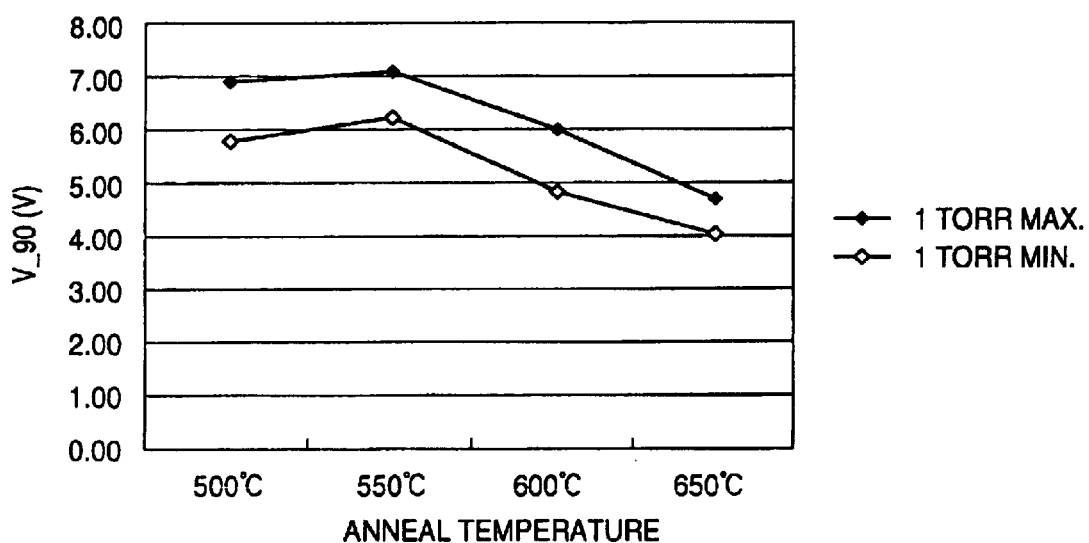
FIG. 20 is a diagram showing the saturation voltage of the ferroelectric capacitor for various annealing temperatures conducted under a reduced pressure environment for crystallizing the ferroelectric film.

FIG. 20 shows the 90%-saturation voltage of the ferroelectric capacitor thus formed for various temperatures used for crystallizing the PLZT film 34. Similarly to the case of FIG. 19, the crystallization of the PLZT film 34 was conducted in the reduced pressure environment of $O_2$ in which the total pressure is set to 1 Torr. In FIG. 20, the open diamonds represent the minimum observed value of the 90%-saturation voltage, while the solid diamonds represent the maximum observed value.

As can be seen clearly from FIG. 20, it is possible to reduce the 90%-saturation voltage to be smaller than 5V, by conducting the crystallization process at 650° C.

Figure 21A:
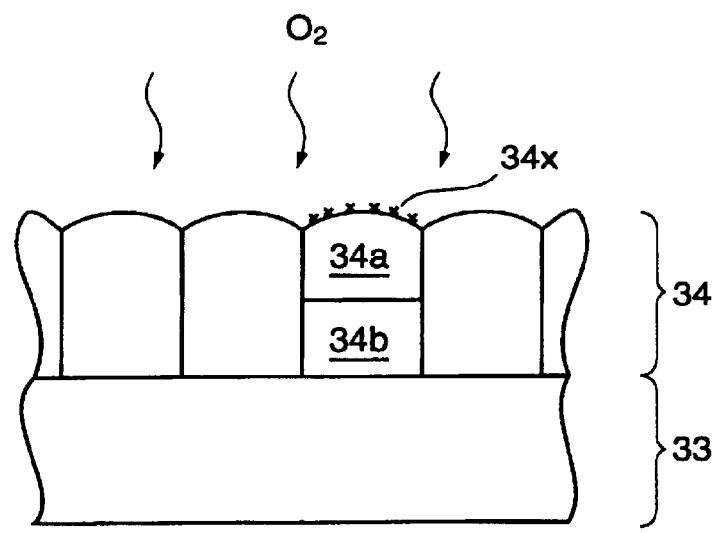
FIGS. 21A and 21B are diagrams showing a two-layer structure and a mechanism of the same.

In the present embodiment, the inventor of the present invention has made an interesting discovery in that appearance of a columnar crystal of PLZT having a vertically split structure as represented schematically in FIG. 21A, of which occurrence is observed occasionally when the crystallizing process is conducted in the mixed atmosphere of Ar and $O_2$ of ordinary total pressure, is eliminated substantially completely when the crystallization process is conducted in a reduced pressure environment as taught in the present embodiment.

In the split columnar crystal of FIG. 21A, it should be noted that the upper part of the crystal grain designated in FIG. 21A by a numeral 34a has an orientation generally different from the desired <111>-orientation for the lower part designated by a reference numeral 34b, and the existence of such a split crystal grain 34a has caused the effect of reducing the total value of the switching electric charge of the ferroelectric capacitor. It is believed that such a split crystal grain 34a is formed due to the crystal growth occurring from the surface of the columnar crystal where Pb in the PLZT crystal grain tends to form a hydroxide or similar compound that act as the nuclei of crystal growth as represented in FIG. 21A by a reference numeral 34x.

Figure 21B:
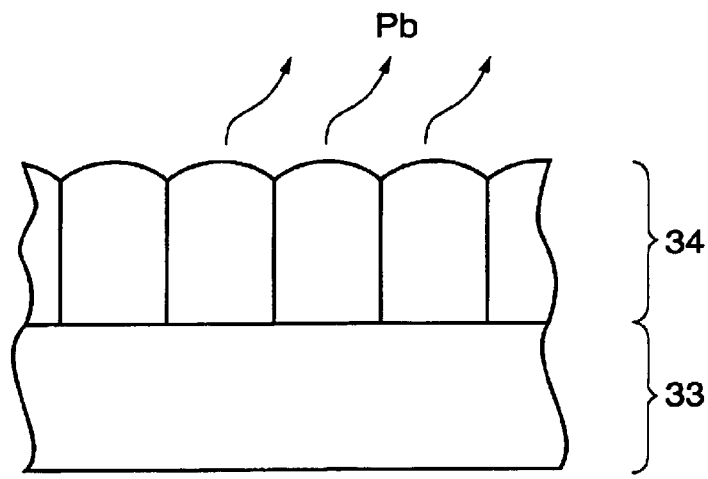

By implementing the crystallization process of the PLZT film 34 in the reduced pressure environment, Pb tends to escape from the part of the PLZT layer 34 by evaporation as represented schematically in FIG. 21B, and the formation of Pb compound 34x, and hence the growth of the split crystal grain 34a using such a Pb compound 34x as the nuclei, is effectively eliminated.

Further, the use of the reduced pressure environment as taught in the present embodiment is advantageous in view point of improving the reproducibility of the crystallization process, as the supply of a fresh $O_2$ atmosphere into a vacuum or reduced pressure environment can be carried out much more stably as compared with the case the freshly supplied $O_2$ atmosphere has to replace or purge the existing atmosphere as in the case of conducting the crystallization process under an ordinary pressure environment.

In the present embodiment, it should be noted that the supply of $O_2$ in the crystallization process can be made also in the form of a mixed gas of $O_2$ and an inert gas such as Ar. It seems that it is important, in any of the present embodiment as well as in the previous embodiment, to supply a limited amount or moles of $O_2$ just enough for deactivating the Ti atoms migrated to the surface of the lower electrode 33. From this view point, the total pressure of the $O_2$ atmosphere used for crystallizing the PLZT film 34, or the partial pressure of the O2 in the Ar—$O_2$ atmosphere in the case of the previous embodiment, should be controlled depending on the Ti atoms on the surface of the lower electrode 33.

Further, in the present embodiment, in which the crystallization process is conducted in a reduced pressure environment, the supply of $O_2$ to the ferroelectric film is achieved more efficiently than in the case of conducting the crystallization under an atmospheric pressure, and it is possible to conduct the crystallizing step and the oxidizing step simultaneously by raising the temperature to 650° C. or more rapidly or stepwise. Further, it is possible to conduct the oxidizing step under a reduced atmosphere of oxygen.

[Third Embodiment]

Figure 22A:
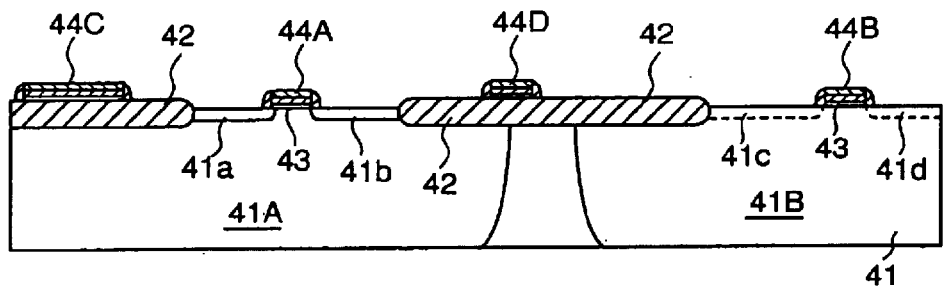
FIGS. 22A–22R are diagrams showing the fabrication process of a semiconductor device according to a third embodiment of the present invention.
Figure 22B:
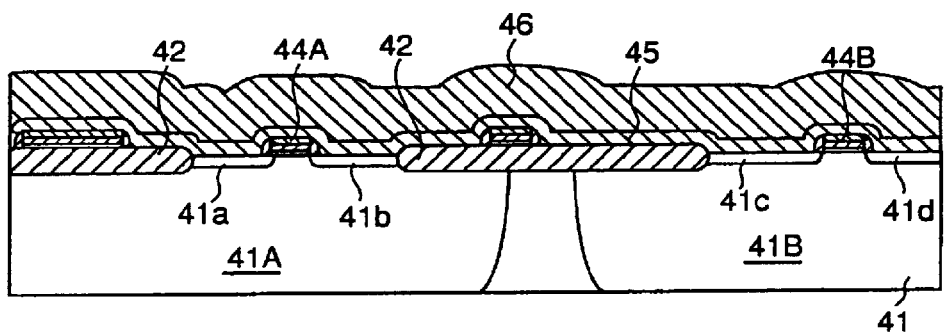
Figure 22C:
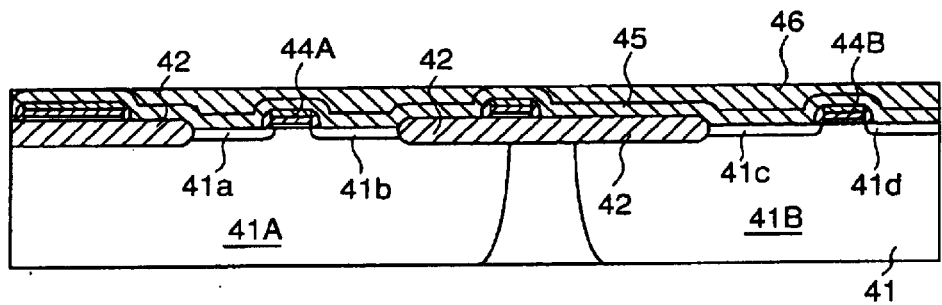
Figure 22D:
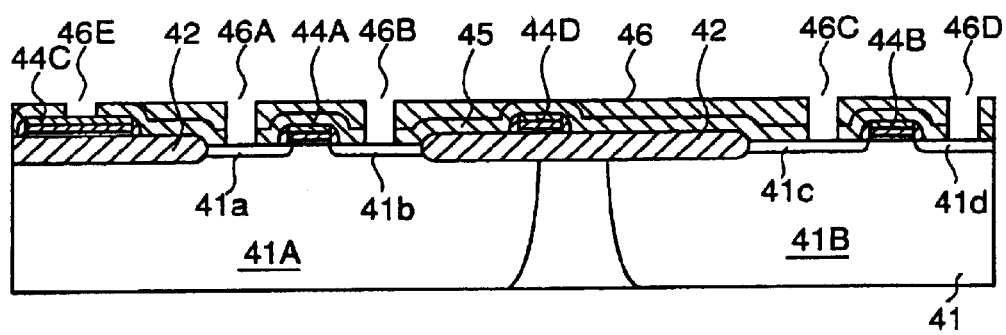
Figure 22E:
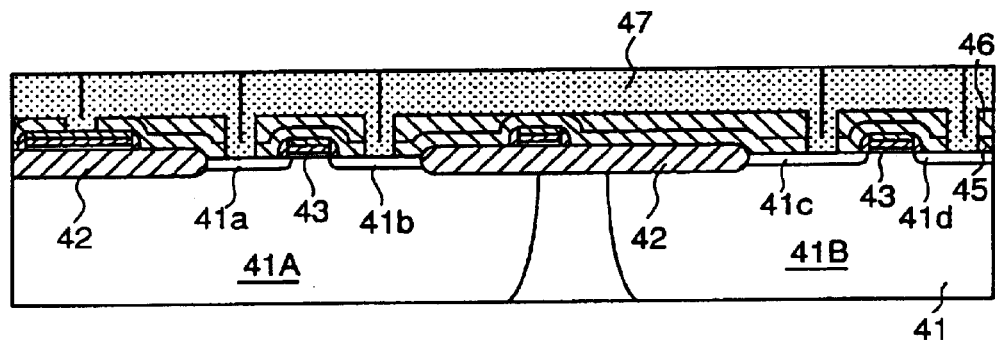
Figure 22F:
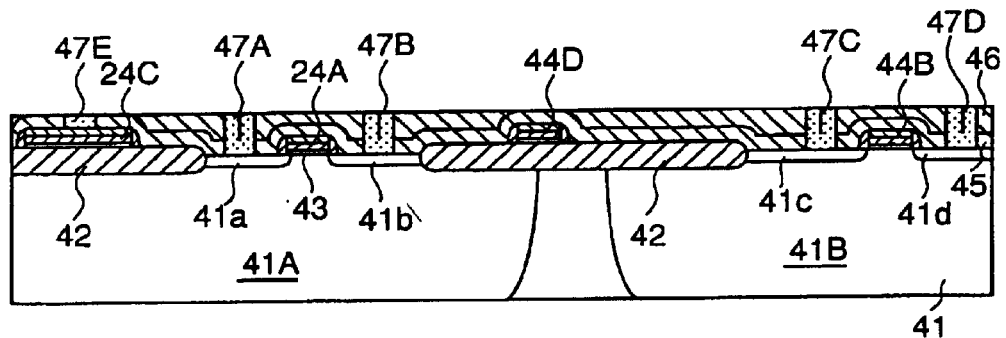
Figure 22G:
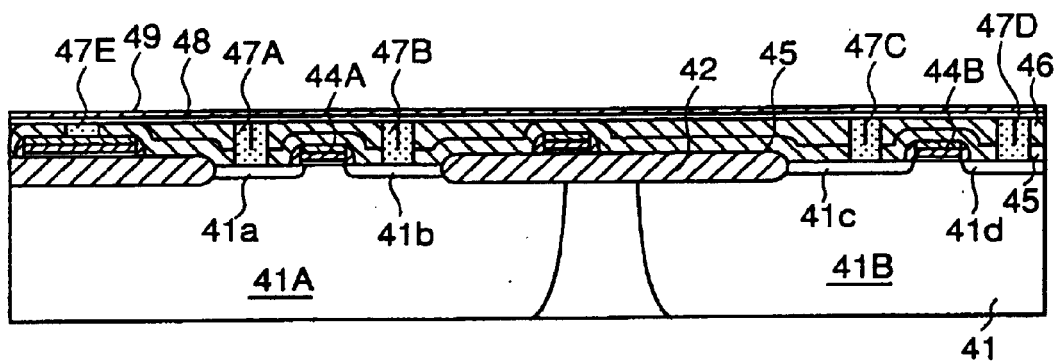
Figure 22H:
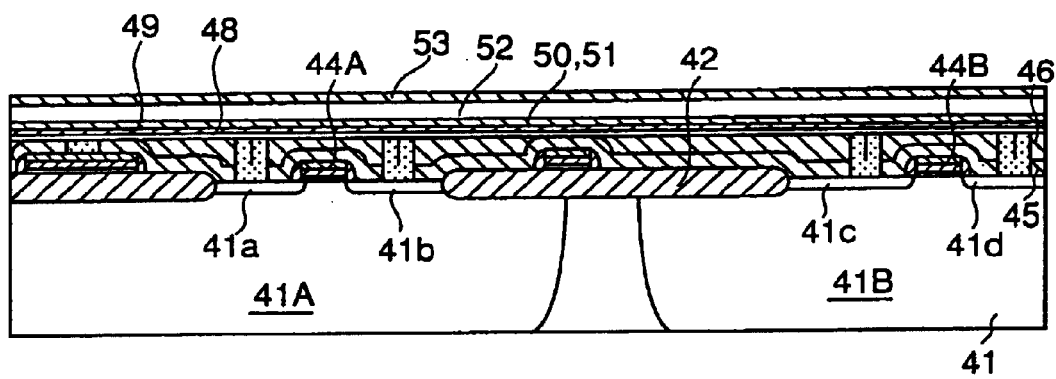
Figure 22:
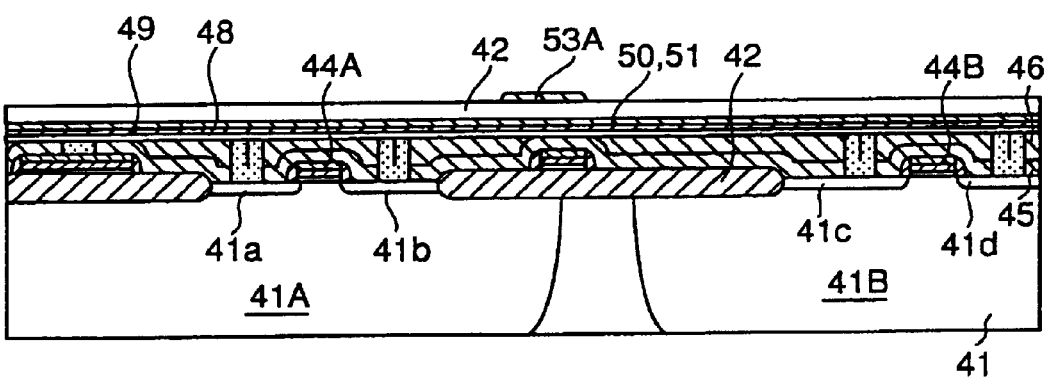
Figure 22J:
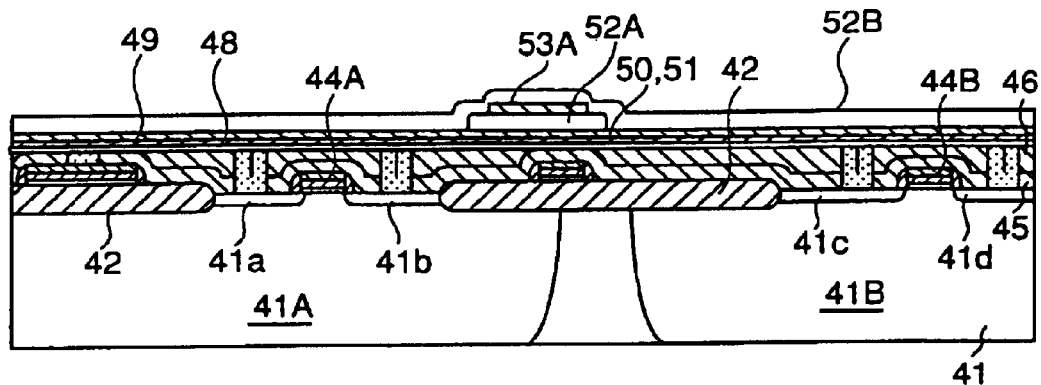
Figure 22K:
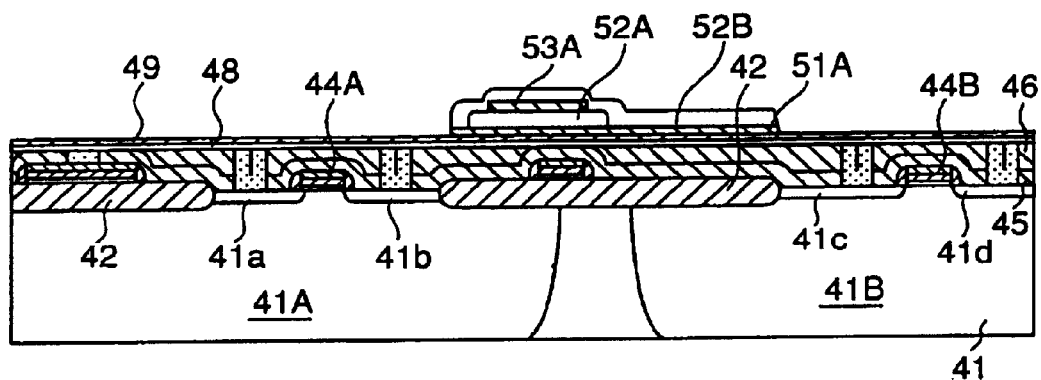
Figure 22L:
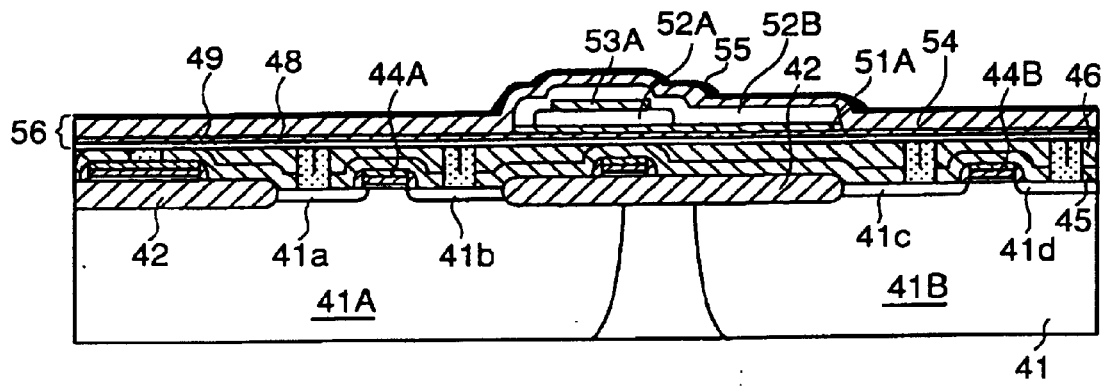
Figure 22M:
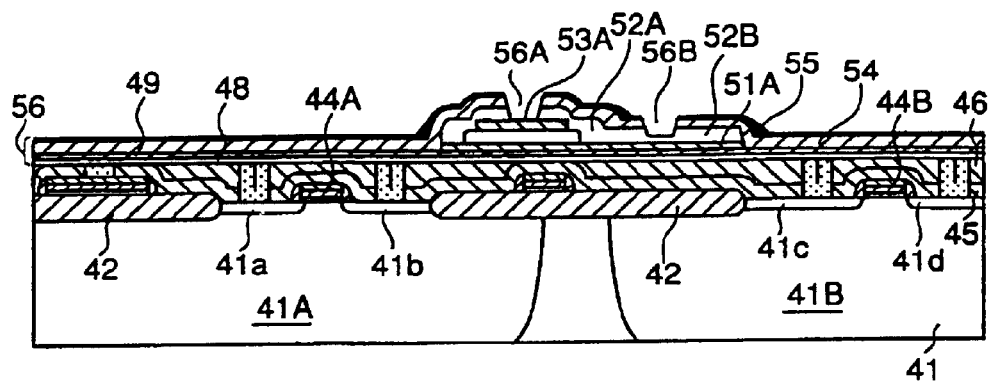
Figure 22N:
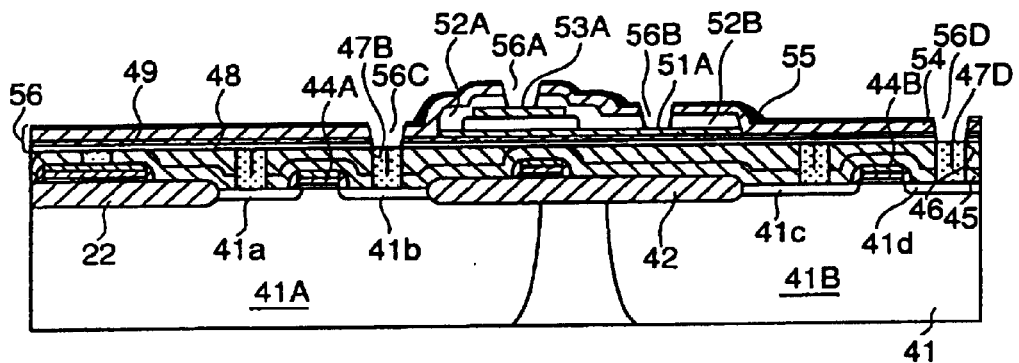
Figure 22O:
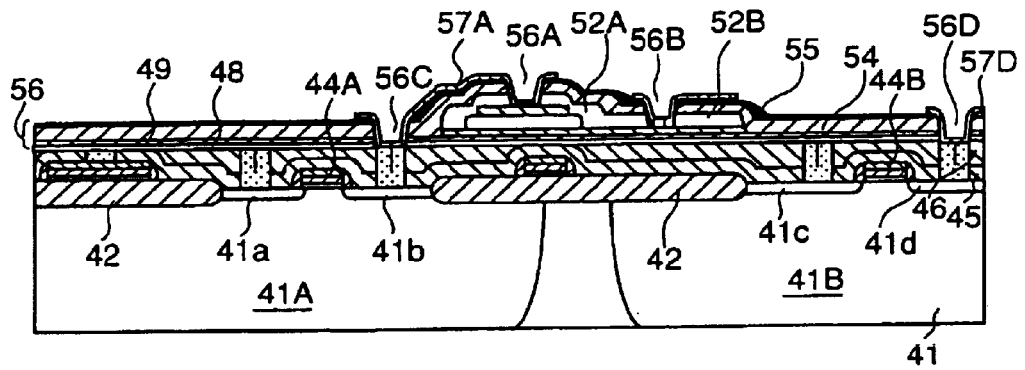
Figure 22P:
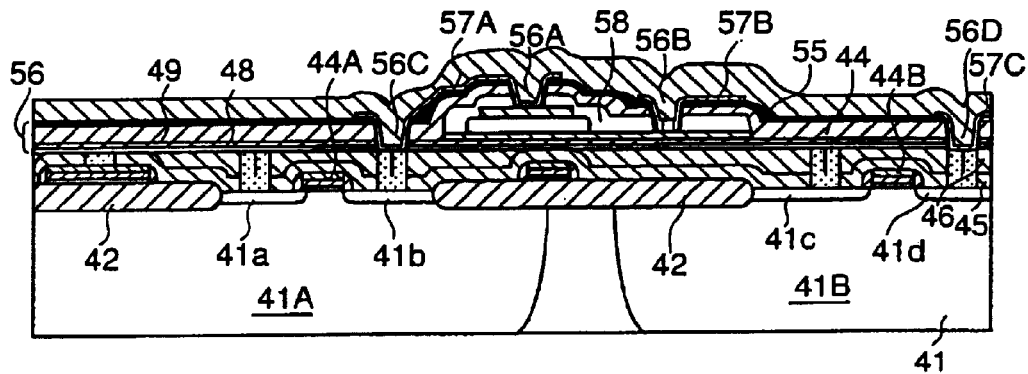
Figure 22Q:
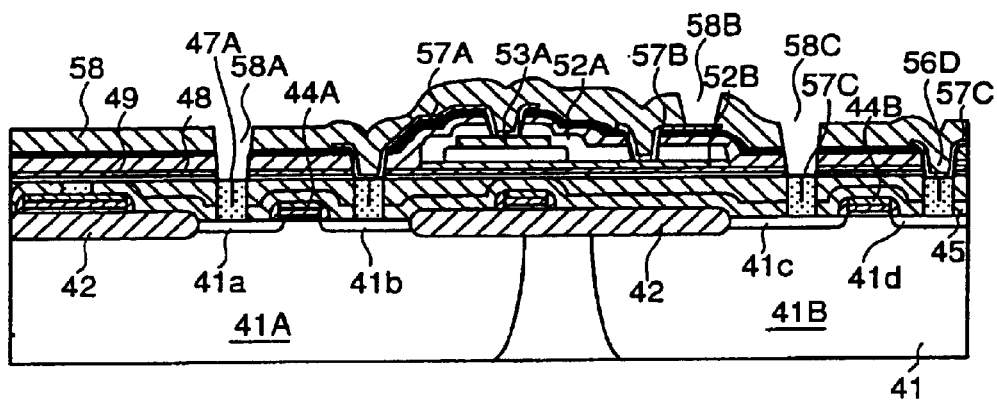
Figure 22R:
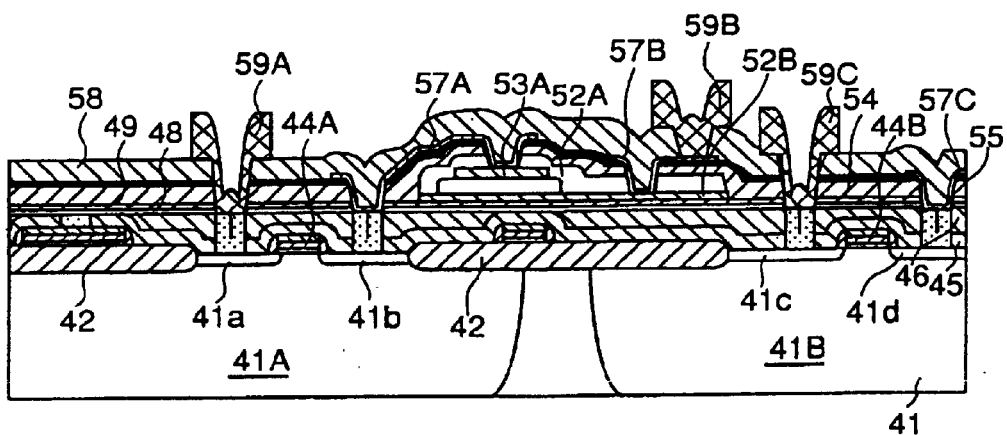

FIGS. 22A–22R show the fabrication process of a semiconductor device according to a third embodiment of the present invention.

Referring to FIG. 22A, a p-type well 41A and an n-type well 41B are formed on a Si substrate 41, which may be any of the p-type or n-type, wherein the Si substrate 41 is covered by a field oxide film 42 defining an active region in each of the p-type well 41A and the n-type well 41B.

Next, a gate oxide film 43 is formed on the active region of the p-type well 41A and also on the active region of the n-type well 41B, and a p-type polysilicon gate electrode 44A is formed on the gate oxide film 43 in the p-type well 41A. Similarly, an n-type polysilicon gate electrode 44B is formed on the gate oxide film 43 in correspondence to the n-type well 41B. In the illustrated example, polysilicon interconnection patterns 44C and 44D are formed further on the field oxide film 42 similarly to the polysilicon gate electrodes 44A and 44B.

In the structure of FIG. 22A, there are formed n-type diffusion regions 41$a$ and 41$b$ in the active region of the p-type well 41A by conducting an n-type impurity element by an ion implantation process, while using the gate electrode 44A and the side wall insulation films thereon as a self-alignment mask. Similarly, p-type diffusion regions 41$c$ and 41$d$ are formed in the active region of the n-type well 41B by an ion implantation process of a p-type impurity element, while using the gate electrode 44B and the side wall insulation films thereon as a self-alignment mask.

The process so far is nothing but an ordinary CMOS process.

Next, in the step of FIG. 22B, an SiON film 45 is deposited on the structure of FIG. 22A by a CVD process with a thickness of about 200 nm, and an $SiO_2$ film 46 is further deposited on the SiON film 45 by a CVD process with a thickness of about 1000 nm.

Further, in the step of FIG. 22C, the $SiO_2$ film 46 is subjected to a CMP process while using the SiON film 45 as a polishing stopper, and contact holes 46A–46D are formed in the step of FIG. 22D in the $SiO_2$ film 46 thus planarized such that the diffusion regions 41$a$, 41$b$, 41$c$ and 41$d$ are exposed by the contact holes 46A, 46B, 46C and 46D. In the illustrated example, the $SiO_2$ film 46 is further formed with a contact hole 46E so as to expose the interconnection pattern 44C.

Next, in the step of FIG. 22E, a W layer 47 is deposited on the structure of FIG. 22D so as to fill the contact holes 46A–46E, wherein the W layer 47 thus deposited is subjected to a CMP process while using the $SiO_2$ film 46 as a stopper. As a result of the polishing process, there are formed W plugs 47A–47E respectively in correspondence to the contact holes 46A–46E.

Next, in the step of FIG. 22G, an oxidization stopper film 48 of SiN and an $SiO_2$ film 49 are deposited consecutively on the structure of FIG. 22F respectively with the thicknesses of 100 nm and 130 nm, followed by a thermal annealing process conducted in an $N_2$ atmosphere at 650° C. for about 30 minutes. The thermal annealing process is conducted so as to thoroughly remove gases from the structure thus formed.

Next, in the step of FIG. 22H, a Ti film 50 and a Pt film 51 are deposited consecutively on the $SiO_2$ film 49 with respective thicknesses of 20 nm and 175 nm by a sputtering process, which may be conducted according to the condition represented in TABLE I. The Ti film 50 and the Pt film 51 thereon constitute a lower electrode layer of the ferroelectric capacitor to be formed.

After the deposition of the Ti film 50 and the Pt film 51, a ferroelectric film 52 of PZT or PLZT is sputter-deposited in the step of FIG. 22H under the condition of TABLE II, wherein the ferroelectric film 52 may contain Ca or Sr.

Further, in the step of FIG. 22H, the ferroelectric film 52 is subjected to a crystallization process first by an RTA process conducted in an mixed atmosphere containing 1–50% of oxidizing gas, followed by an oxidizing process by an RTA process conducted in an oxidizing atmosphere, as represented in the Run No. 5 or 6 of TABLE III. Alternatively, the crystallization process of the ferroelectric film 52 may be conducted in a reduced pressure environment containing $O_2$ as described already.

Further, in the step of FIG. 22H, a Pt film 53 is deposited on the ferroelectric film 52 thus processed as an upper electrode layer by a sputtering process conducted according to the condition of TABLE IV.

Next, in the step of FIG. 22I, a resist pattern is formed on the upper electrode layer 53, followed by the patterning of the upper electrode layer 53 by a dry etching process to form an upper electrode pattern 53A on the ferroelectric film 52. In the step of FIG. 22I, it should further be noted that the ferroelectric film 52 is subjected, after the foregoing sputtering and patterning of the upper electrode pattern 53A, to a recovery annealing process conducted in an $O_2$ atmosphere at 650° C. for 60 minutes so as to recover any damages caused in the ferroelectric film 52 as a result of the foregoing sputtering and patterning processes.

Next, in the step of FIG. 22J, a resist pattern having a shape corresponding to the shape of the capacitor insulation film to be formed, is formed on the ferroelectric insulation film 52, and the ferroelectric insulation film 52 is subjected to a dry etching process while using the foregoing resist pattern as a mask. As a result, a desired capacitor insulation film pattern 52A is formed on the underlying lower electrode layer 51. Further, an encapsulating layer 52B is formed on the lower electrode layer 51 by a ferroelectric material having a composition substantially identical with that of the material constituting the ferroelectric film 52, by conducting a sputtering process with a thickness of about 20 nm. The encapsulating layer 52B thus deposited is then annealed by an RTA process in the $O_2$ atmosphere at 700° C. for 60 seconds with a temperature profile of about 125° C./min. The encapsulating layer 52B thereby protects the ferroelectric capacitor insulation film pattern 52A from reduction.

Next, in the step of FIG. 22K, a resist pattern is formed on the lower electrode layer 51 so as to cover the encapsulating layer 52B with a pattern corresponding to the lower electrode pattern to be formed. Further, by conducting a dry etching process on the foregoing encapsulating layer 52B and the underlying Pt and Ti films 50 and 51 underneath the encapsulating layer 52B by a dry etching process, a lower electrode pattern 51A is formed.

After the formation of the lower electrode pattern 51A, the resist pattern is removed in the step of FIG. 22K, and the damages that are introduced into the ferroelectric capacitor insulation film 52A during the dry etching process of the lower electrode pattern 51A are recovered by conducting a recovery annealing process in an $O_2$ atmosphere at 650° C. for 60 minutes.

Next, in the step of FIG. 22L, an $SiO_2$ film 54 is deposited on the structure of FIG. 22K by a CVD process, typically with a thickness of about 200 nm, followed by a formation of an SOG film 55 thereon, wherein the SOG film 55 smoothes any sharp steps formed on the underlying $SiO_2$ film 54. The $SiO_2$ film 54 and the SOG film 55 form together an interlayer insulation film 56.

Next, in the step of FIG. 22M, contact holes 56A and 56B are formed in the interlayer insulation film 56 so as to expose the upper electrode pattern 53A and the lower electrode pattern 51A respectively, and contact holes 56C and 56D are formed further in the step of FIG. 22N in the interlayer insulation film 56 so as to expose the W plugs 47B and 47D respectively through the underlying $SiO_2$ film 49 and the SiN film 48. Further, in the step of FIG. 22M, a recovery annealing process is conducted, after the dry etching process for forming the contact holes 56A and 56B, in an $O_2$ atmosphere at 550° C. for 60 minutes. As a result of the recovery annealing process, any damages introduced into the ferroelectric film patterns 52A and 52B during the dry etching process are eliminated.

Next, in the step of FIG. 22O, a local interconnection pattern 57A is formed by a TiN film such that the local interconnection pattern 57A connects the contact hole 56A and the contact hole 56C electrically. Further, a similar local interconnection pattern 57B and 57C are formed on the contact holes 56B and 56C.

Next, in the step of FIG. 22P, an $SiO_2$ film 58 is formed on the structure of FIG. 22O, and contact holes 58A, 58B and 58C are formed in the $SiO_2$ film in the step of FIG. 17Q so as to expose the W plug 47A, the local interconnection pattern 57B and the W plug 47C, respectively.

Further, in the step of FIG. 22R, electrodes 59A, 59B and 59C are formed respectively in correspondence to the contact holes 58A, 58B and 58C.

Further, the process of forming the interlayer insulation film and the interconnection patterns may be repeated as desired, to form a multilayer interconnection structure.

According to the present embodiment, the peeling of the ferroelectric capacitor insulation film pattern 52A is eliminated by conducting the crystallization process in an atmosphere containing an inert gas and an oxidizing gas. By using a limited amount of $O_2$ in the crystallizing process, the microstructure of the ferroelectric capacitor insulation film pattern 52A is controlled to have a columnar structure, with small crystal grains, typically having a generally uniform grain diameter of less than about 200 nm, or about 150 nm in average. The ferroelectric capacitor insulation film pattern 52A having such a columnar microstructure has the desired <111> orientation and is characterized by a large switching electrical charges $Q_{SW}$ and small saturation voltage.

In the crystallization process conducted in the partially oxidizing atmosphere, it should be noted that the oxidizing gas is not limited to $O_2$ but other gas containing oxygen such as $N_2O$, NO, $NO_2$, and the like may be used as well. Further, the inert gas used in the partially oxidizing atmosphere is not limited to Ar but $N_2$, He, Ne, Xe, and the like may also be used.

Further, it should be noted that the foregoing first and second RTA steps may be conducted continuously in a single step, by interrupting the supply of the inert gas and by increasing the oxygen concentration in correspondence to the second RTA process.

Further, the ferroelectric film of the present invention is not limited to the PZT or PLZT film described heretofore, but other ferroelectric material having the perovskite structure or a layered Bi compound may also be used.

Further, the present invention is not limited to the embodiments described heretofore, but various variations and modifications may be made without departing from the scope of the present invention.

What is claimed is:

1. A method of fabricating a semiconductor device having a ferroelectric capacitor, comprising the steps of:

forming an active device element on a substrate;

forming an insulation film over said substrate to cover said active device element;

forming a lower electrode layer of said ferroelectric capacitor over said insulation film, such that said lower electrode is formed on a layer containing Ti;

forming a ferroelectric film on said lower electrode as a capacitor insulation film of said ferroelectric capacitor;

crystallizing said ferroelectric film by applying a thermal annealing process in an $O_2$ atmosphere under a reduced total pressure in the range between 1 Torr and 40 Torr such that peeling of the ferroelectric film is substantially reduced: and forming an upper electrode layer on said ferroelectric film.

* * * * *